US011710763B2

(12) United States Patent
Chen et al.

(10) Patent No.: US 11,710,763 B2
(45) Date of Patent: Jul. 25, 2023

(54) METAL CAPACITOR

(71) Applicant: MACRONIX INTERNATIONAL CO., LTD., Hsinchu (TW)

(72) Inventors: Chung-Kuang Chen, Hsinchu (TW); Chia-Ching Li, Hsinchu (TW); Chien-Fu Huang, Kaohsiung (TW); Chia-Ming Hu, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/471,216

(22) Filed: Sep. 10, 2021

(65) Prior Publication Data

US 2021/0408226 A1 Dec. 30, 2021

Related U.S. Application Data

(63) Continuation of application No. 16/784,292, filed on Feb. 7, 2020, now Pat. No. 11,152,458.

(51) Int. Cl.
*H01G 4/232* (2006.01)
*H01L 49/02* (2006.01)
(Continued)

(52) U.S. Cl.
CPC ............. *H01L 28/86* (2013.01); *H01G 4/012* (2013.01); *H01G 4/232* (2013.01); *H01G 4/30* (2013.01); *H01G 4/33* (2013.01); *H01G 4/38* (2013.01); *H01L 23/5222* (2013.01); *H01L 23/5223* (2013.01); *H01L 27/0629* (2013.01)

(58) Field of Classification Search
CPC . H01L 28/86; H01L 23/5222; H01L 23/5223; H01L 27/0629; H01G 4/232; H01G 4/012; H01G 4/30; H01G 4/33; H01G 4/38
See application file for complete search history.

(56) References Cited

U.S. PATENT DOCUMENTS 6,383,858 B1 5/2002 Gupta et al.
6,465,868 B1 10/2002 Ehben et al.
(Continued)

FOREIGN PATENT DOCUMENTS

TW I512969 B 12/2015
TW I652796 B 3/2019

*Primary Examiner* — Ahmed N Sefer
(74) *Attorney, Agent, or Firm* — McClure, Qualey & Rodack, LLP

(57) ABSTRACT

A metal capacitor provided includes a first metal layer and a second metal layer disposed above a substrate. The first metal layer includes a first electrode sheet and a second electrode sheet, and the second metal layer includes a third electrode sheet and a fourth electrode sheet. The first electrode sheet and the second electrode sheet collectively form a first coplanar capacitor. The third electrode sheet and the fourth electrode sheet collectively form a second coplanar capacitor. At least a portion of the fourth electrode sheet is arranged above the first electrode sheet, and the first electrode sheet and the fourth electrode sheet collectively form a first vertical capacitor. At least a portion of the third electrode sheet is arranged above the second electrode sheet, and the second electrode sheet and the third electrode sheet collectively form a second vertical capacitor.

20 Claims, 19 Drawing Sheets

(51) Int. Cl.
*H01L 23/522* (2006.01)
*H01G 4/30* (2006.01)
*H01G 4/012* (2006.01)
*H01G 4/38* (2006.01)
*H01G 4/33* (2006.01)
*H01L 27/06* (2006.01)

(56) References Cited

U.S. PATENT DOCUMENTS

| | | | |
|---|---|---|---|
| 6,653,681 B2 | 11/2003 | Appel | |
| 6,822,312 B2 | 11/2004 | Sowlati et al. | |
| 7,154,734 B2 * | 12/2006 | Schultz | H01G 2/22 |
| | | | 361/321.2 |
| 7,639,474 B1 * | 12/2009 | Chen | H01L 23/5223 |
| | | | 361/321.2 |
| 7,768,044 B2 | 8/2010 | He et al. | |
| 9,385,246 B2 | 7/2016 | Yen et al. | |
| 10,050,351 B2 | 8/2018 | Bower et al. | |
| 2003/0183864 A1 * | 10/2003 | Miyazawa | H01L 27/0805 |
| | | | 257/532 |
| 2006/0237819 A1 * | 10/2006 | Kikuta | H01L 23/5223 |
| | | | 257/532 |
| 2007/0075341 A1 * | 4/2007 | Pan | H01L 27/0805 |
| | | | 257/E29.345 |
| 2007/0296013 A1 | 12/2007 | Chang | |
| 2008/0100989 A1 * | 5/2008 | Chen | H01L 27/0805 |
| | | | 257/E27.048 |
| 2010/0038752 A1 * | 2/2010 | Ng | H01G 4/005 |
| | | | 257/532 |
| 2010/0188799 A1 * | 7/2010 | Galvagni | H01G 4/30 |
| | | | 361/306.3 |
| 2010/0238603 A1 * | 9/2010 | Chung | H01L 28/90 |
| | | | 361/301.4 |
| 2012/0061739 A1 | 3/2012 | Kim et al. | |
| 2012/0151726 A1 * | 6/2012 | Chung | H01L 28/90 |
| | | | 29/25.41 |
| 2013/0194719 A1 * | 8/2013 | Matsukawa | H01G 4/385 |
| | | | 361/303 |
| 2015/0084107 A1 | 3/2015 | Li | |
| 2015/0236014 A1 | 8/2015 | Gathman | |
| 2015/0236711 A1 * | 8/2015 | Aruga | H01L 23/5225 |
| | | | 257/532 |
| 2016/0118343 A1 * | 4/2016 | Tsunemine | H01L 23/5223 |
| | | | 257/532 |
| 2017/0301675 A1 | 10/2017 | Harjani et al. | |
| 2019/0006728 A1 | 1/2019 | Cheng et al. | |
| 2019/0189350 A1 | 6/2019 | Kabir et al. | |
| 2020/0020686 A1 | 1/2020 | Bao et al. | |

* cited by examiner

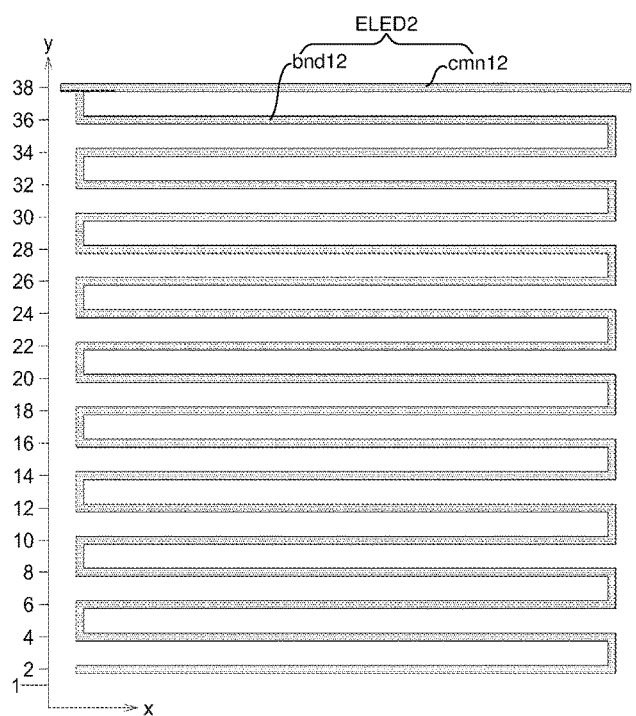
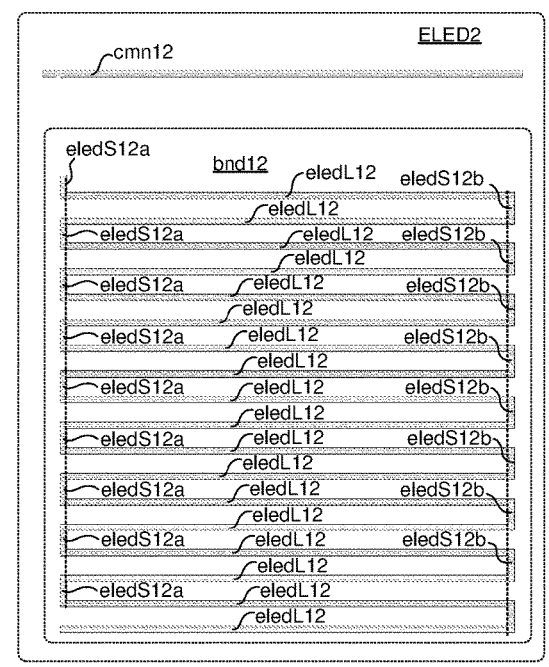
FIG. 8
FIG. 9

METAL CAPACITOR

This is a Continuation of U.S. application Ser. No. 16/784,292, filed Feb. 7, 2020, now U.S. Pat. No. 11,152,458, the subject matter of which is incorporated herein by reference.

BACKGROUND OF THE INVENTION

Field of the Invention

The invention relates in general to a metal capacitor, and more particularly to a metal capacitor taking advantage of parasitic capacitance.

Description of the Related Art

In an analog circuit, the operating voltage required for the internal circuit is usually higher than the supply voltage Vdd received by the system. For example, a memory circuit receives a supply voltage Vdd of 3V, but the select operation, write operation and erase operation of the memory circuit may require higher voltages of 5V, 10V and 12V, respectively. Therefore, a charge pump is usually provided in the analog circuit to generate the operating voltage when the supply voltage (for example, battery voltage) is not high enough.

Please refer to FIG. 1, which is a circuit diagram of a voltage multiplier circuit. The voltage multiplier circuit 10 includes a cascade of charge pumps 10a. While being driven by the clock signals clk and clkb in antiphase alternately, each later-stage charge pump 10a generates a higher voltage. The quantity of the charge pumps 10a included in the voltage multiplier circuit 10 is determined according to the supply voltage Vdd and the output voltage Vout.

In FIG. 1, each charge pump 10a includes two inverters connected in series, a boot capacitor Cb and a diode-wired pass metal-oxide-semiconductor field-effect transistor (MOSFET). Two terminals of the boot capacitor Cb receive the boost voltage Vb and the driving clock signal clkd, respectively. In the charge pump 10a, the boot capacitor Cb occupies many areas. Therefore, it is desired to reduce the area of the boot capacitor Cb to cut down the production cost.

SUMMARY OF THE INVENTION

The invention is directed to a metal capacitor taking advantage of parasitic capacitance occurring on dummy metal layers. This metal capacitor could be used with a MOS capacitor to increase the capacitance without additional area.

According to one aspect of the present invention, a metal capacitor is provided. The metal capacitor includes a first metal layer and a second metal layer. The first metal layer is disposed above a substrate, and the second metal layer is disposed above the first metal layer. The first metal layer includes a first electrode sheet and a second electrode sheet, both of which collectively form a first coplanar capacitor. The second metal layer includes a third electrode sheet and a fourth electrode sheet, both of which collectively form a second coplanar capacitor. At least a portion of the fourth electrode sheet is arranged above the first electrode sheet, and the first electrode sheet and the fourth electrode sheet collectively form a first vertical capacitor. At least a portion of the third electrode sheet is arranged above the second electrode sheet, and the second electrode sheet and the third electrode sheet collectively form a second vertical capacitor.

According to another aspect of the present invention, a metal capacitor is provided. The metal capacitor includes at least one metal layer disposed above a metal-oxide-semiconductor capacitor. The metal layer includes a first electrode sheet and a second electrode sheet. The first electrode sheet receives a first voltage, and the second electrode sheet receives a second voltage.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 8 is a schematic diagram illustrating the configuration of the electrode sheet ELED2.

FIG. 9 is a schematic diagram illustrating the components of the electrode pattern of the electrode sheet ELED2.

DETAILED DESCRIPTION OF THE INVENTION

MOS capacitors are widely used in semiconductor devices, but the MOS capacitors occupy larger areas. Therefore, it is an important issue to reduce the area of the boot capacitors Cb in the semiconductor circuits. For illustration purposes, the capacitor implemented by a MOSFET is referred to as MOS capacitor C_MOS hereinafter.

In a memory circuit, many metal layers are formed for access to memory cells. These metal layers are provided mainly for the control of the memory cell circuits, but these metal layers located in the non-memory cell circuits (for example, MOS capacitors C_MOS in the charge pumps) are unused. In other words, the metal layers disposed above the MOS capacitors C_MOS are unused. Accordingly, the present disclosure transforms the unused dummy metal layers above the MOS capacitors C_MOS into metal capacitors C_MET. The metal capacitors C_MET are connected to the MOS capacitors C_MOS in parallel to increase the effective capacitance of the boot capacitor Cb. In other types of circuits having charge pumps, any existing dummy metal layer can be put to use in a similar way to increase the effective capacitance of the boot capacitor Cb.

Figure 1:
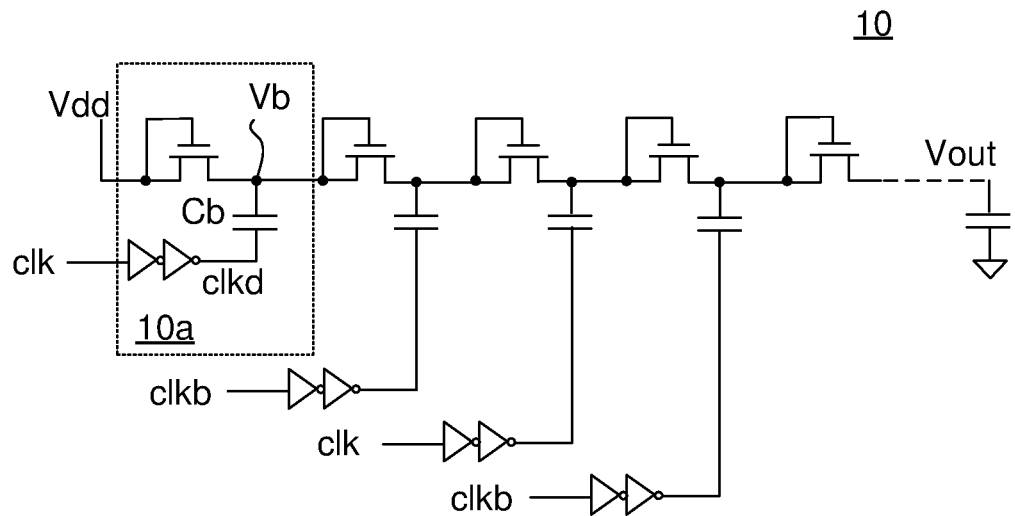
FIG. 1 (prior art) is a circuit diagram of a voltage multiplier circuit.
Figure 2:
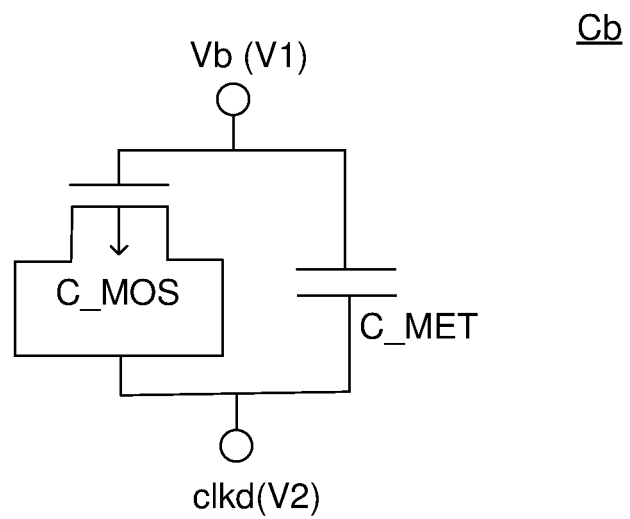
FIG. 2 is a circuit diagram showing the metal capacitor C_MET and the MOS capacitor C_MOS connected in parallel.

Please refer to FIG. 2, which is a circuit diagram showing the metal capacitor C_MET and the MOS capacitor C_MOS connected in parallel. According to the embodiment of the present disclosure, the boot capacitor Cb includes the metal capacitor C_MET and the MOS capacitor C_MOS.

In the MOS capacitor C_MOS, the gate of the transistor is electrically connected to the boot voltage Vb, and the source and drain of the transistor are electrically connected to the driving clock signal clkd. On the other hand, two terminals of the metal capacitor C_MET receive the boot voltage Vb and the driving clock signal clkd, respectively. Therefore, the metal capacitor C_MET and the MOS capacitor C_MOS are electrically connected, in parallel, between the boot voltage Vb and the driving clock signal clkd. To simplify the term, the boot voltage Vb is defined as the voltage V1, and the driving clock signal clkd is defined as the voltage V2 hereinafter.

When the metal capacitor C_MET and the MOS capacitor C_MOS are connected in parallel, the effective capacitance of the boot capacitor Cb is increased. According to a simulation result, the capacitance of the boot capacitor Cb is increased with 40% by using the metal capacitor C_MET. Since the metal capacitor C_MET is implemented by a dummy metal layer, no additional area is required. Therefore, the additional capacitance contributed by the metal capacitor C_MET can reduce the area required for the MOS capacitor C_MOS.

Figure 3:
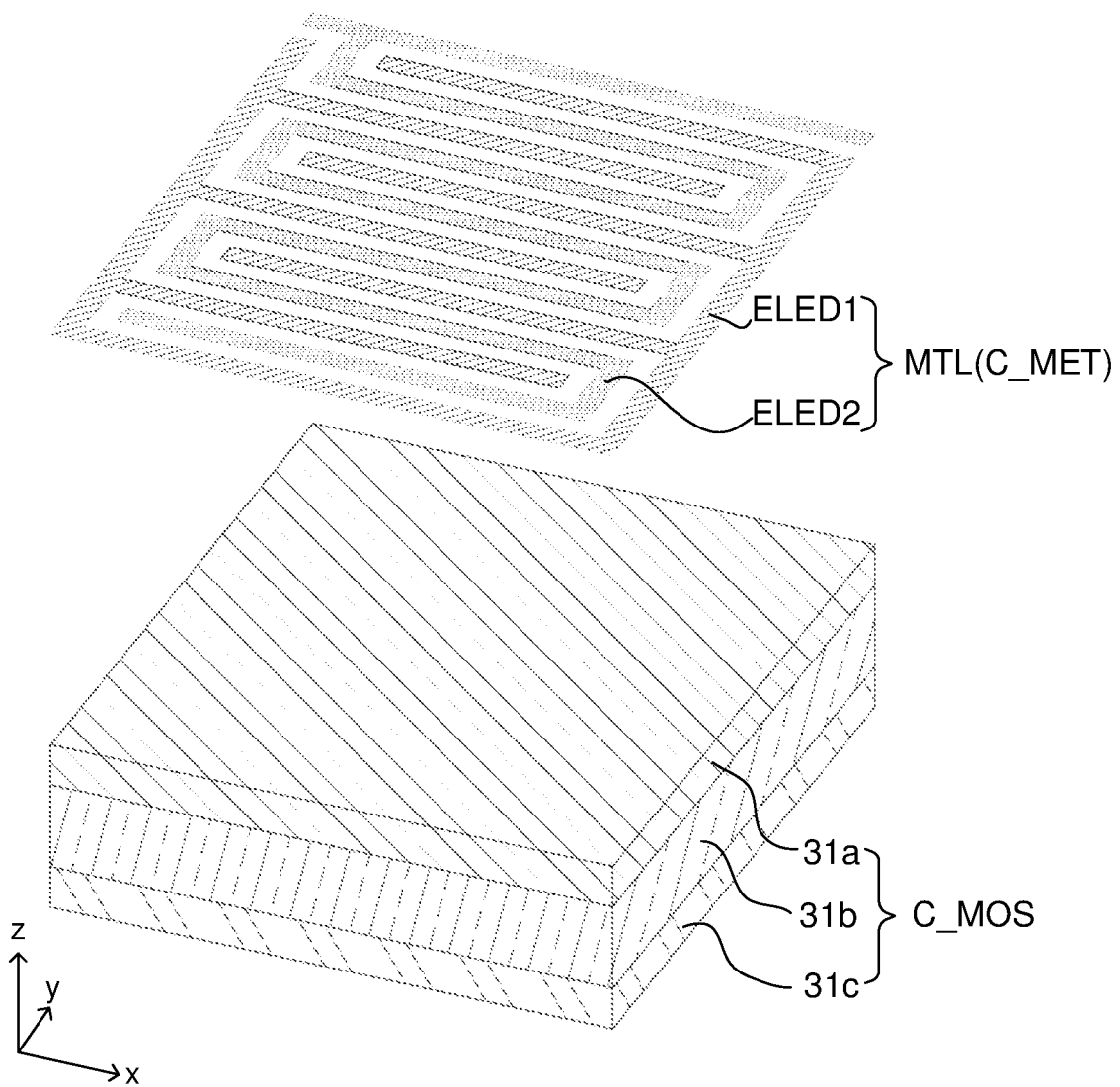
FIG. 3 is a schematic diagram illustrating an electrode pattern on the metal layer disposed above the MOS capacitor.

Please refer to FIG. 3, which is a schematic diagram illustrating an electrode pattern on the metal layer disposed above the MOS capacitor. The MOS capacitor C_MOS includes polysilicon layers 31a and 31c and a diffusion layer 31b. The details of the manufacturing process of the MOS capacitor C_MOS is not given herein. At least one metal layer MTL is disposed above the MOS capacitor C_MOS. The metal layer MTL forms the metal capacitor C_MET. In the embodiment, the MOS capacitor C_MOS and the metal capacitor C_MET has a width of about 20 μm along the x-axis and the y-axis. It is to be noted that the width of the metal layer MTL depends upon the design parameters, and is not limited to that described in the embodiments of the present disclosure. The position of the metal capacitor C_MET is just above the MOS capacitor C_MOS (that is, toward positive z-axis). The MOS capacitor C_MOS having the layered structure is defined as a substrate hereinafter.

In FIG. 3, the metal layer MTL includes two electrode sheets ELED1 and ELED2. In the specification, it is defined that the electrode (sheet) with the upper right to lower left hatch pattern receives the voltage V1, and the electrode (sheet) with the dot hatch pattern receives the voltage V2. Accordingly, in FIG. 3, the electrode sheet ELED1 receives the voltage V1, and the electrode sheet ELED2 receives the voltage V2. Since the electrode sheets ELED1 and ELED2 receive different voltages, charges are accumulated close to the gap between the electrode sheets ELED1 and ELED2 to generate parasitic capacitance. Therefore, additional capacitance is provided between the electrode sheets ELED1 and ELED2.

In the specification, the separate electrode sheets belonging to a single metal layer form a capacitor, which is defined as a coplanar capacitor Ch. The capacitance of the coplanar capacitance Ch is directly proportional to the overall area of the lateral surfaces, at the opposite sides of the gap, of the two electrode sheets, and is inversely proportional to the separation distance between the lateral surfaces (that is, gap thickness). Therefore, when the electrode sheets have more electrodes and/or the electrodes are arranged more closely, the coplanar capacitor Ch has higher capacitance.

When the semiconductor circuit includes more than one metal layer, in addition to the coplanar capacitor Ch involving the separate electrode sheets of the single metal layer, parasitic capacitance may also exist between electrodes (sheets) belonging to different metal layers receiving different voltages. The capacitor resulting from different metal layers is defined as an inter-layer capacitor Cv.

Taking a memory circuit as an example, four metal layers may be provided above the MOS capacitor. According to the concept of the present disclosure, each of the four metal layers includes two electrode sheets for receiving the voltages V1 and V2, respectively. The shape of and the voltage received by each electrode sheet are designed according to the position coordinate. For illustration purposes, the following description only describes the relative position of the metal layers and the electrode sheets, but not further shows the position relation between the substrate and the metal layers.

For clearly describing the position relation of the electrode patterns of the electrode sheets and the metal layers, it is defined that the x-axis, the y-axis and the z-axis correspond to the lengthwise direction, the widthwise direction, and the height direction, respectively. Each metal layer has a unique z-coordinate. It is to be noted that the directions and relative positions may vary with real conditions.

Figure 4:
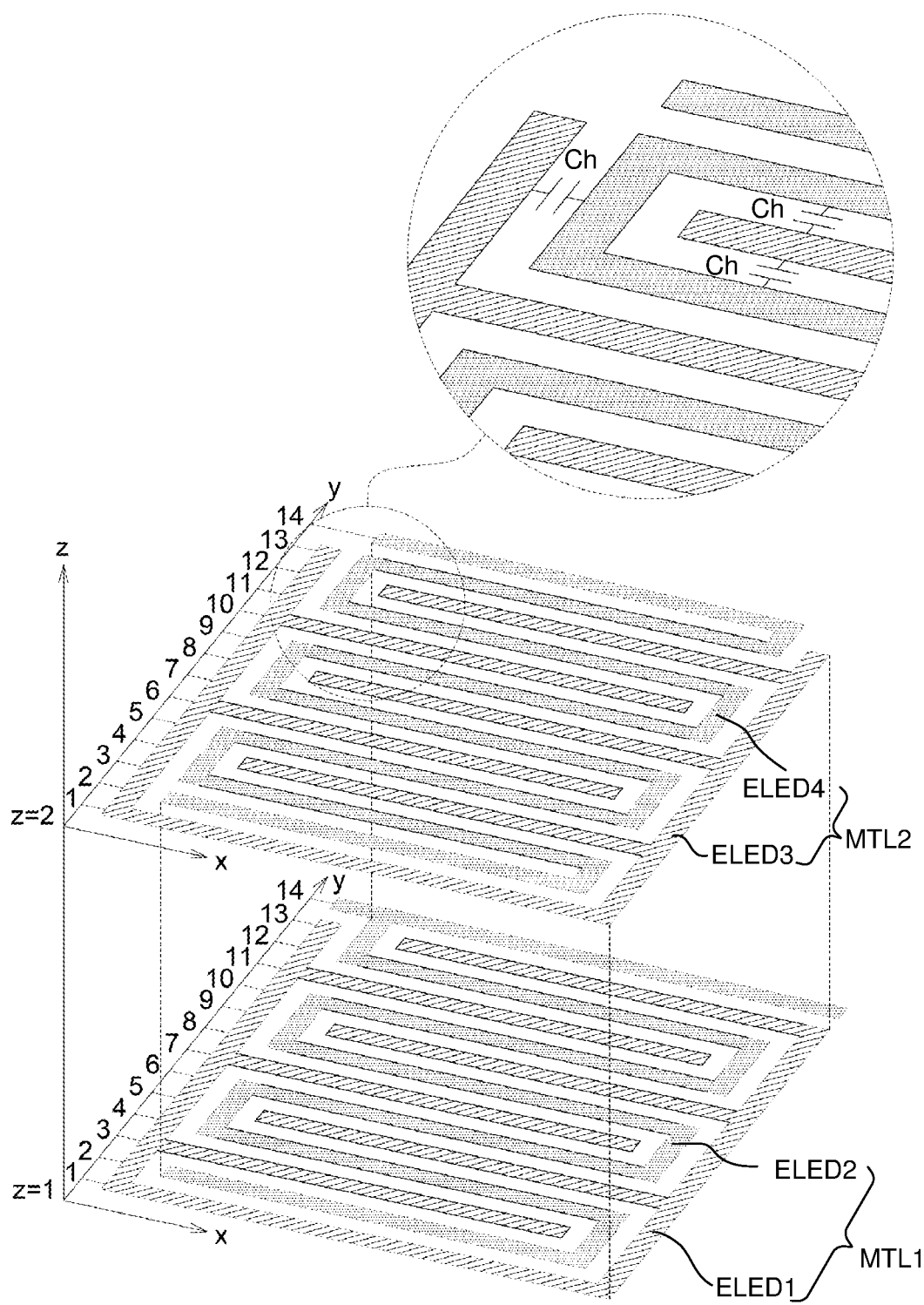
FIG. 4 is a schematic diagram illustrating that electrode sheets are formed of two metal layers, and the capacitance is formed based on the electrode patterns of the electrode sheets according to an embodiment of the present disclosure.

Please refer to FIG. 4, which is a schematic diagram illustrating that electrode sheets are formed of two metal layers, and the capacitance is formed based on the electrode patterns of the electrode sheets according to an embodiment of the present disclosure. In this embodiment, two metal layers MTL1 and MLT2, are disposed above the substrate. Concretely speaking, the metal layer MTL1 is disposed above the substrate, and the metal layer MTL2 is disposed above the metal layer MTL1. Further, the metal layer MTL1 includes electrode sheets ELED1 and ELED2, and the metal layer MTL2 includes electrode sheets ELED3 and ELED4. The electrode sheets ELED1 and ELED3 receive the voltage V1, and the electrode sheets ELED2 and ELED4 receive the voltage V2.

From the drawing of partial enlargement at the upper right corner, in the metal layer MTL2, the electrode sheets ELED3 and ELED4 receive the voltages V1 and V2, respectively, and collectively form the coplanar capacitor Ch. Similarly, in the metal layer MTL1, the electrode sheets ELED1 and ELED2 receive the voltages V1 and V2, respectively, and collectively form the coplanar capacitor Ch.

In addition to the coplanar capacitor resulting from each metal layer, an inter-layer capacitor is formed by arranging the electrodes in a specific manner. For example, when the electrode of the electrode sheet of the metal layer MTL2 receives a different voltage from the electrode of the electrode sheet of the metal layer MTL1 wherein both the electrodes have corresponding positions to each other (that is, same x-coordinate and y-coordinate), the two electrodes collectively form the inter-layer capacitor Cv. As the inter-layer capacitor Cv is formed by electrodes which are vertically overlapped, the inter-layer capacitor Cv can also be defined as a vertical capacitor.

Considering the two metal layers MTL1 and MTL2, at least a portion of the electrode sheet ELED4 is disposed above the electrode sheet ELED1. Since the electrode sheet ELED1 and the electrode sheet ELED4 receive the voltage V1 and the voltage V2, respectively, the inter-layer capacitor Cv is formed by the overlapping portions of the electrode sheet ELED1 and the electrode sheet ELED4. Similarly, since at least a portion of the electrode sheet ELED3 is disposed above the electrode sheet ELED2, another inter-layer capacitor Cv is formed by the overlapping portions of the electrode sheet ELED2 and the electrode sheet ELED3.

Please refer to the electrode sheets ELED1, ELED2, ELED3, and ELED4 in FIG. 4. The electrodes with a heavy border will form the inter-layer capacitors Cv with upper or lower corresponding electrodes (that is, electrodes with greater or smaller z-coordinates). On the other hand, the electrodes with a light border do not form the inter-layer capacitors Cv with upper or lower corresponding electrodes (that is, electrodes with greater or smaller z-coordinates).

The details about whether the electrodes at specific positions would form the inter-layer capacitors Cv or not will be given below.

In FIG. 4, the electrode pattern of the electrode sheet ELED1 resembles the electrode pattern of the electrode sheet ELED3, while the electrode pattern of the electrode sheet ELED2 resembles the electrode pattern of the electrode sheet ELED4. In other words, in the metal layers MTL1 and MTL2, the electrode sheets ELED1 and ELED3 receive the same voltage V1 and have a similar configuration, while the electrode sheets ELED2 and ELED4 receive the same voltage V2 and have a similar configuration.

From FIG. 4, coplanar capacitors Ch and inter-layer capacitors Cv are formed by any proper pairs of the electrode sheets ELED1, ELED2, ELED3, and ELED4. The principle of forming the coplanar capacitors Ch and the inter-layer capacitors Cv with the electrode sheets ELED1, ELED2, ELED3, and ELED4 and the connection relations between the coplanar capacitors Ch and the inter-layer capacitors Cv will be described with reference to FIGS. 5A-5D.

Please refer to FIGS. 5A, 5B, 5C, and 5D, which are schematic diagrams showing the mutual capacitance between the electrode sheets of the two metal layers. The relative positions of the electrode sheets ELED1, ELED2, ELED3, and ELED4 and the coplanar capacitors Ch and the inter-layer capacitors Cv formed thereby are rearranged and shown in FIG. 5A.

In the metal layer MTL1, since the electrode sheets ELED1 and ELED2 receive different voltages, the electrode sheets ELED1 and ELED2 collectively form the coplanar capacitor Ch1. Similarly, in the metal layer MTL2, since the electrode sheets ELED3 and ELED4 receive different voltages, the electrode sheets ELED3 and ELED4 collectively form the coplanar capacitor Ch2. Further, focusing on the overlapping portions of the metal layers MTL1 and MTL2, the electrode sheets ELED1 and ELED4 collectively form the inter-layer capacitor Cv1, and the electrode sheets ELED2 and ELED3 collectively form the inter-layer capacitor Cv2.

Figure 5A:
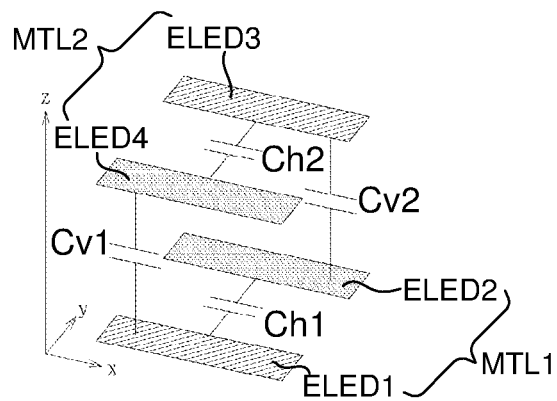
FIGS. 5A, 5B, 5C, and 5D are schematic diagrams showing the mutual capacitance between the electrode sheets of the two metal layers.
Figure 5B:
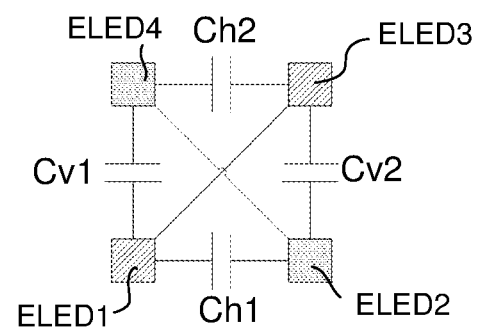
Figure 5C:
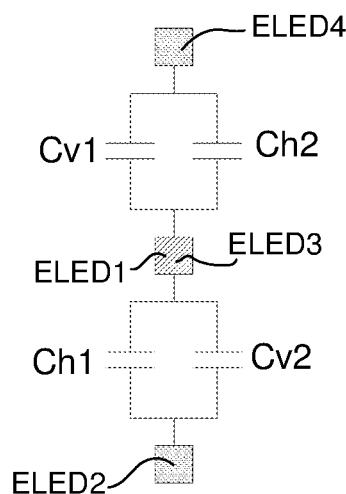
Figure 5D:
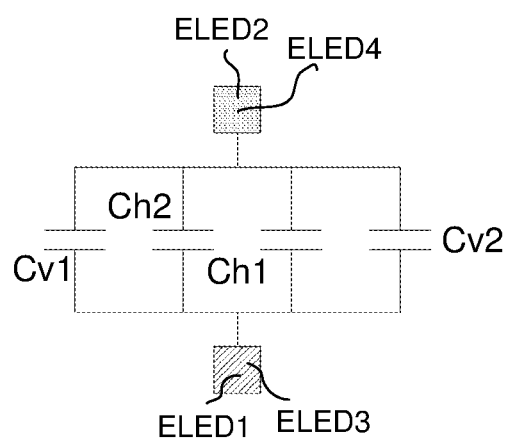

Viewing the coplanar capacitors Ch1, Ch2, and the inter-layer capacitors Cv1, Cv2 from the x-z plane in FIG. 5A, the relative positions are rearranged and shown in FIG. 5B. Since both the electrode sheets ELED1 and ELED3 receive the voltage V1, the voltage levels on the electrode sheets ELED1 and ELED3 are equal to each other. Therefore, the equivalent circuit of FIG. 5B is simplified as shown in FIG. 5C. Similarly, since both the electrode sheets ELED2 and ELED4 receive the voltage V2, the voltage levels on the electrode sheets ELED2 and ELED4 are equal to each other. Therefore, the equivalent circuit of FIG. 5C may be further simplified, as shown in FIG. 5D.

According to the description with reference to FIGS. 5A-5D, proper design of the electrode patterns of the electrode sheets ELED1, ELED2, ELED3, and ELED4 of the metal layers MTL1 and MTL2 can generate multiple capacitors (including the inter-layer capacitors Cv and the coplanar capacitors Ch) connected in parallel. Therefore, the parasitic capacitance effect resulting from especially designed electrode patterns on the dummy metal layers can be used to form the metal capacitor C_MET in FIG. 2 to increase the effective capacitance of the boot capacitor Cb.

The electrode sheets ELED1, ELED2, ELED3, and ELED4 shown in FIG. 4 have fewer electrodes than real applications due to the drawing limitation. In an embodiment to be described, in the top view within an area of 20 μm*20 μm, each of the metal layers MTL1 and MTL2 includes 38 row electrodes parallel to the x-axis. It is to be noted that the area and the number of the row electrodes depend upon the design parameters, and are not limited to the embodiment. As described above, the closer the electrodes are, the higher the capacitance is. Therefore, arranging the row electrodes in high density can increase the capacitance of the coplanar capacitors Ch1 and Ch2.

Figure 6:
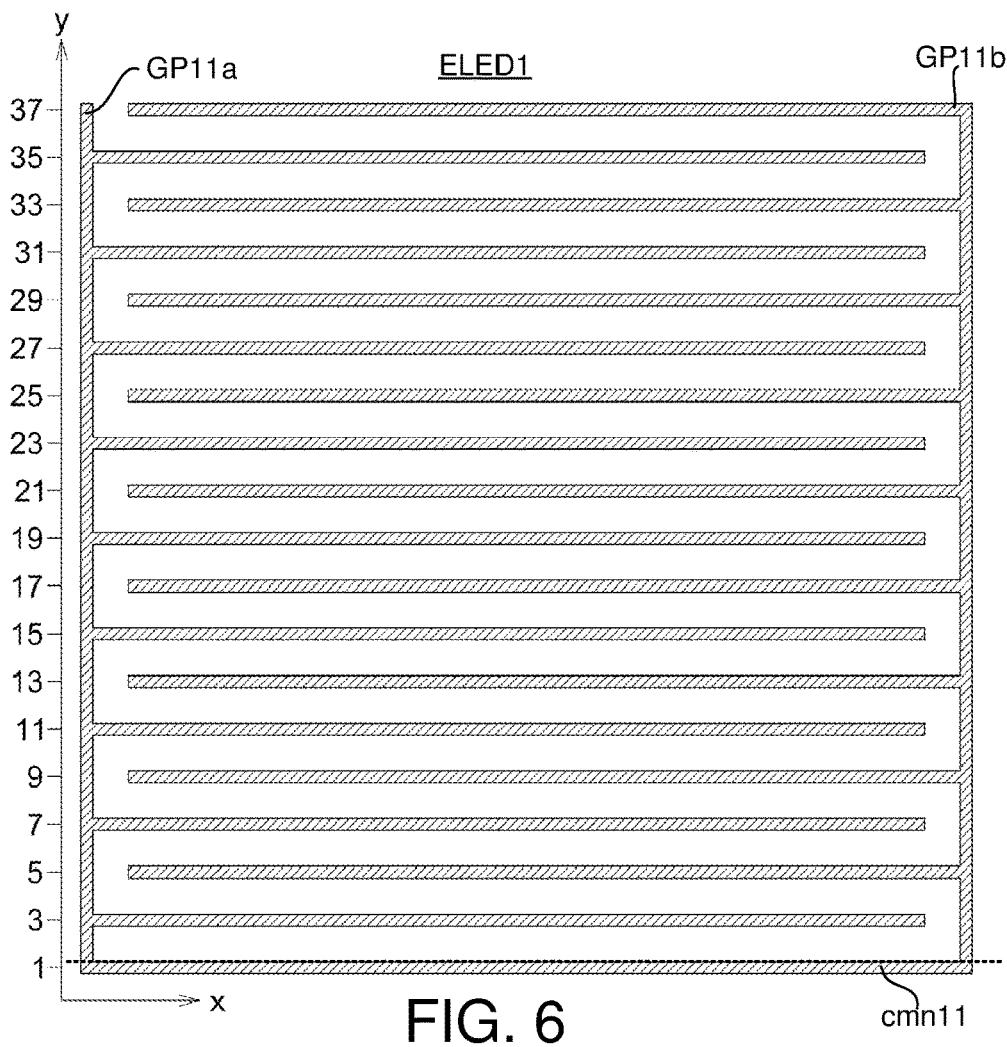
FIG. 6 is a schematic diagram illustrating the configuration of the electrode sheet ELED1.
Figure 7:
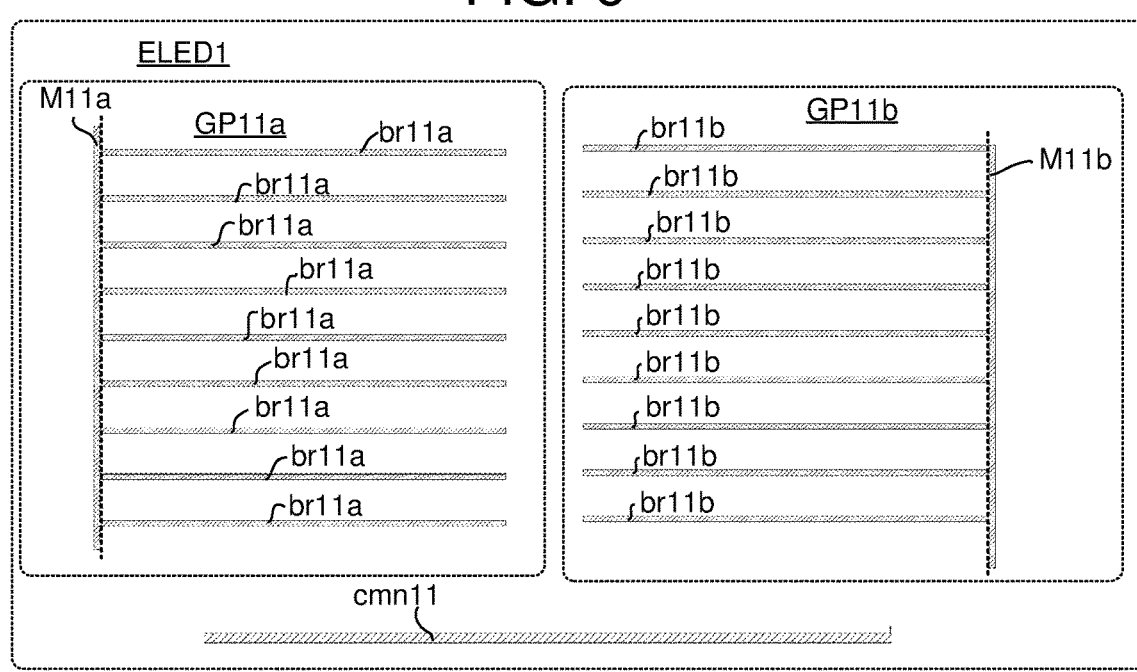
FIG. 7 is a schematic diagram illustrating the components of the electrode pattern of the electrode sheet ELED1.
Figure 10:
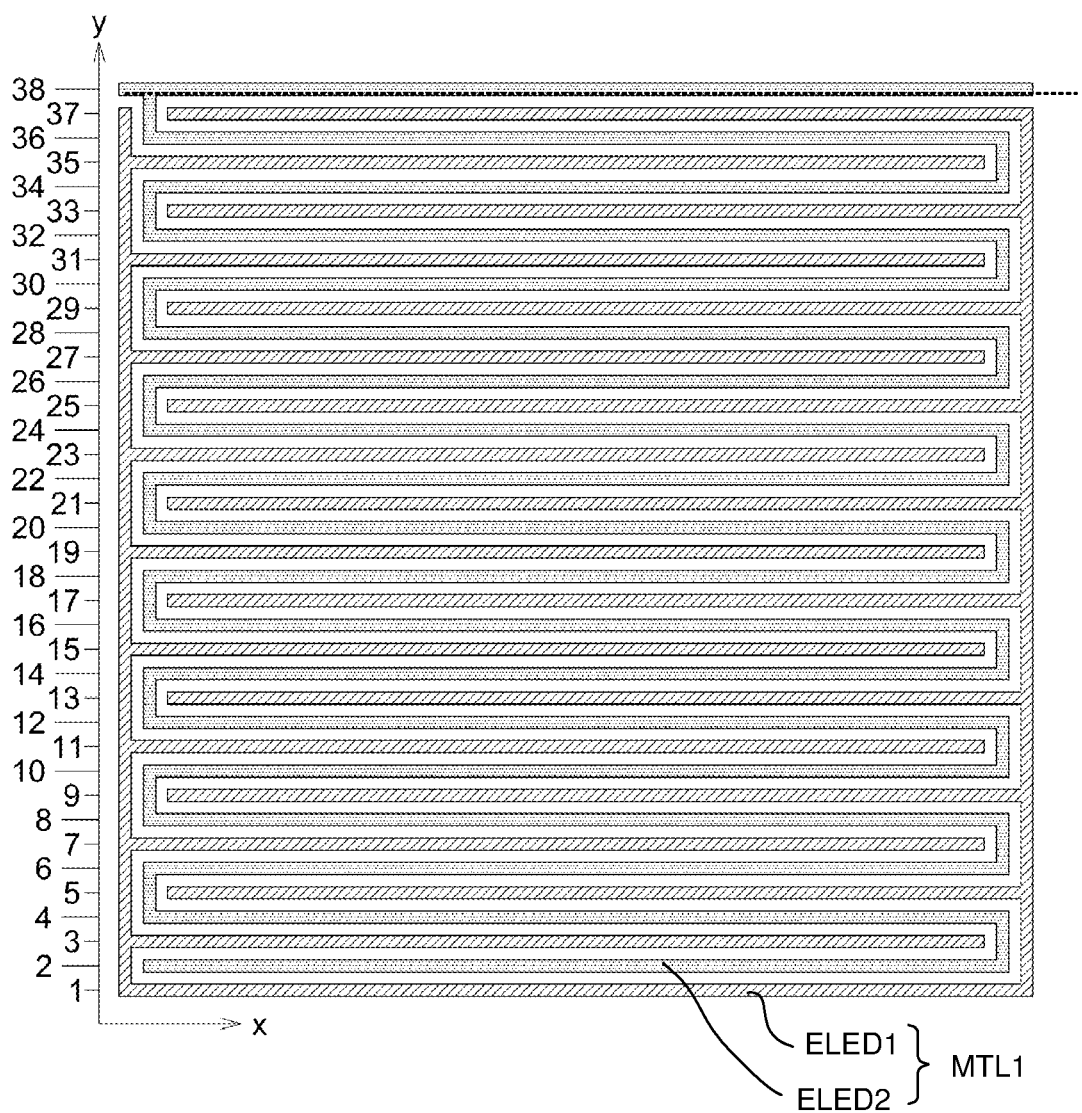
FIG. 10 is a schematic diagram illustrating that the electrode sheet ELED1 in FIG. 6, and the electrode sheet ELED2 in FIG. 8 are combined to provide the metal layer MTL1.

In the following description, FIGS. 6 and 7 illustrate the electrode pattern of the electrode sheet ELED1; FIGS. 8 and 9 illustrate the electrode pattern of the electrode sheet ELED2, and FIG. 10 illustrates the electrode pattern on the metal layer MTL1 after combining the electrode sheets ELED1 and ELED2.

Please refer to FIG. 6, which is a schematic diagram illustrating the configuration of the electrode sheet ELED1. The electrode sheet ELED1 includes a common electrode cmn11 and electrode sets GP11a and GP11b. The common electrode cmn11 is directly connected to both of the electrode sets GP11a and GP11b.

Please refer to FIG. 7, which is a schematic diagram illustrating the components of the electrode pattern of the electrode sheet ELED1. The electrode set GP11a is shown at the left side, the electrode set GP11b is shown at the right side, and the common electrode cmn11 is shown at the bottom.

The electrode set GP11a includes: a main electrode M11a parallel to the y-axis and connected to the common electrode cmn11 and a plurality of branch electrodes br11a parallel to the x-axis. The branch electrodes br11a are of equal length and connected to the main electrode M11a with the left ends. The right ends of the branch electrodes br11a extend toward the positive x-axis. The electrode set GP11b includes: a main electrode M11b parallel to the y-axis and connected to the common electrode cmn11, and a plurality of branch electrodes br11b parallel to the x-axis. The branch electrodes br11b are of equal length and connected to the main electrode M11b with the right ends. The left ends of the branch electrodes br11b extend toward the negative x-axis. Therefore, each of the electrode sets GP11a and GP11b has the shape of a flat comb. The teeth of the electrode set GP11a extend toward the positive x-axis, and the teeth of the electrode set GP11b extend toward the negative x-axis.

The common electrode cmn11 is parallel to the x-axis, and two ends of the common electrode cmn11 are connected to the bottoms of the main electrodes M11a and M11b, respectively. The common electrode cmn11 is longer than the branch electrodes br11a of the electrode set GP11a and is also longer than the branch electrodes br11b of the electrode set GP11b.

Please refer to both FIG. 6 and FIG. 7. In the electrode sheet ELED1, the branch electrodes br11a and the branch electrodes br11b are arranged at different row positions and interleaved in an alternate manner. When the metal layer MTL1 includes 38 row electrodes in total, the electrode set GP11a includes 9 branch electrodes br11a, and the electrode set GP11b includes 9 branch electrodes br11b. The common electrode cmn11 is arranged at the first row (y=1); the branch electrodes br11a are arranged from the third row at 4-row intervals (y=3, 7, . . . 35); and the branch electrodes br11b are arranged from the 5th row at 4-row intervals (y=5, 9, . . . 37).

Please refer to FIG. 8, which is a schematic diagram illustrating the configuration of the electrode sheet ELED2. The electrode sheet ELED2 includes a common electrode cmn12 and a bent electrode bnd12. The common electrode cmn12 is parallel to the x-axis, and the bent electrode bnd12 is zigzag-shaped (like an upright square wave).

Please refer to FIG. 9, which is a schematic diagram illustrating the components of the electrode pattern of the electrode sheet ELED2. The common electrode cmn12 is shown at the top, and the bent electrode bnd12 is shown at the lower portion.

The common electrode cmn12 is parallel to the x-axis and has a length slightly longer than the bent electrode bnd12 along the x-axis. The bent electrode bnd12 includes a plurality of long electrodes eledL12 and a plurality of short electrodes eledS12a and eledS12b. The long electrodes eledL12 are of equal length and parallel to the x-axis, while the left ends of the long electrodes eledL12 are aligned with a straight line, and the right ends of the long electrodes eledL12 are aligned with another straight line. As shown in FIG. 8, the long electrodes eledL12 are arranged at even-numbered rows (y is an even number).

Please refer to both FIG. 8 and FIG. 9. The short electrodes eledS12a and eledS12b of the bent electrode bnd12 are parallel to the y-axis. Each of the short electrodes eledS12a and eledS12b has a head end and a tail end. The short electrodes eledS12a are connected to the left ends of the long electrodes eledL12 with the head ends, and the tail ends, and the short electrodes eledS12b are connected to the right ends of the long electrodes eledL12 with the head ends and the tail ends. Further, the left end and the right end of one long electrode eledL12 are connected to one short electrode eledS12a and one short electrode eledS12b extending toward opposite directions along the y-axis.

For example, the right ends of the long electrodes eledL12 arranged in the second row, and the fourth row are connected to two ends of the short electrodes eledS12b arranged at the right side, respectively. Similarly, the left ends of the long electrodes eledL12 arranged at the 4th row and the 6th row are connected to two ends of the short electrodes eledS12a arranged at the left side, respectively. Similarly, the right ends of the long electrodes eledL12 arranged at the 6th row, and the 8th row are connected to two ends of the right-side short electrodes eledS12b, respectively. Similarly, the left ends of the long electrodes eledL12 arranged in the 8th row, and the 10th row are connected to two ends of the left-side short electrodes eledS12a, respectively. Other connection relations of the long electrodes eledL12 and the short electrodes eledS12a and eledS12b could be derived in a similar manner and are not particularly described herein.

That is to say, the positions of the left-side short electrodes eledS12a and the right-side short electrodes eledS12b are alternate along the y-axis. Besides, the left-side short electrodes eledS12a connected to the long electrode eledL12 arranged at the 36th row is further connected to the common electrode cmn12 with the head end.

Please refer to FIG. 10, which is a schematic diagram illustrating that the electrode sheet ELED1 in FIG. 6, and the electrode sheet ELED2 in FIG. 8 are combined to provide the metal layer MTL1. The electrode sheet ELED1 in FIG. 6 and the electrode sheet ELED2 in FIG. 8 collectively constitute the metal layer MTL1 in FIG. 10. The electrode positions of the electrode sheets ELED1 and ELED2 of the metal layer MTL1, as illustrated in FIGS. 6, 8, and 10 are listed in Table 1.

TABLE 1

| Metal layer MTL1 | Electrode type | | Direction | Row number of the electrode |
|---|---|---|---|---|
| Electrode sheet ELED1 (FIGS. 6, 7) | Electrode set GP11a | Main electrode M11a | y-axis | NA |
| | | Branch electrode br11a | x-axis | 3, 7, 11, 15, 19, 23, 27, 31, 35 |
| | Electrode set GP11b | Main electrode M11b | y-axis | NA |
| | | Branch electrode br11b | x-axis | 5, 9, 13, 17, 21, 25, 29, 33, 37 |
| | Common electrode cmn11 | | x-axis | 1 |
| Electrode sheet ELED2 (FIGS. 8, 9) | Common electrode cmn12 | | x-axis | 38 |
| | Bent electrode bnd12 | Long electrode eledL12 | x-axis | 2, 4, 6, 8, 10, 12, 14, 16, 18, 20, 22, 24, 26, 28, 30, 32, 34, 36 |
| | | Short electrode eledS12a, eledS12b | y-axis | NA |

From Table 1, it is shown that the branch electrodes br11a and br11b of the electrode sheet ELED1 receiving the voltage V1 are mainly arranged at the odd-numbered rows, and the long electrodes eledL12 of the electrode sheet ELED2 receiving the voltage V2 are mainly arranged at the even-numbered rows. Therefore, the adjacent row electrodes of the metal layer MTL1 can form the coplanar capacitors Ch1.

Figure 11:
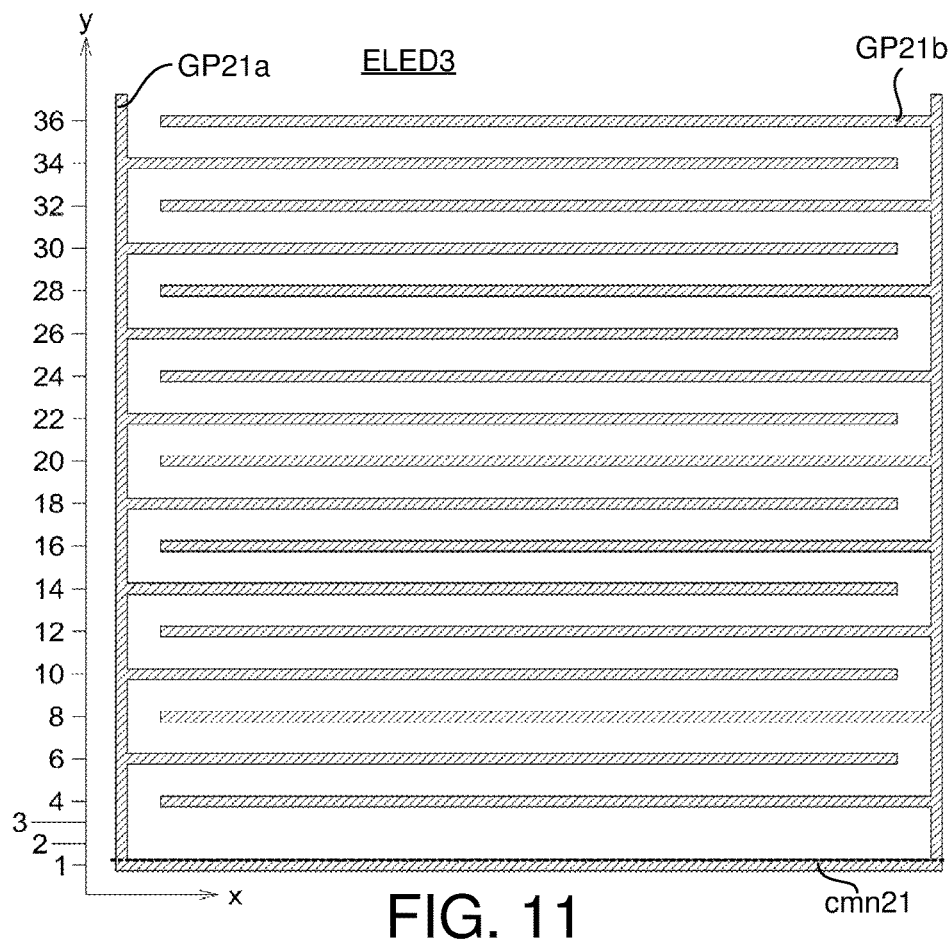
FIG. 11 is a schematic diagram illustrating the configuration of the electrode sheet ELED3.
Figure 12:
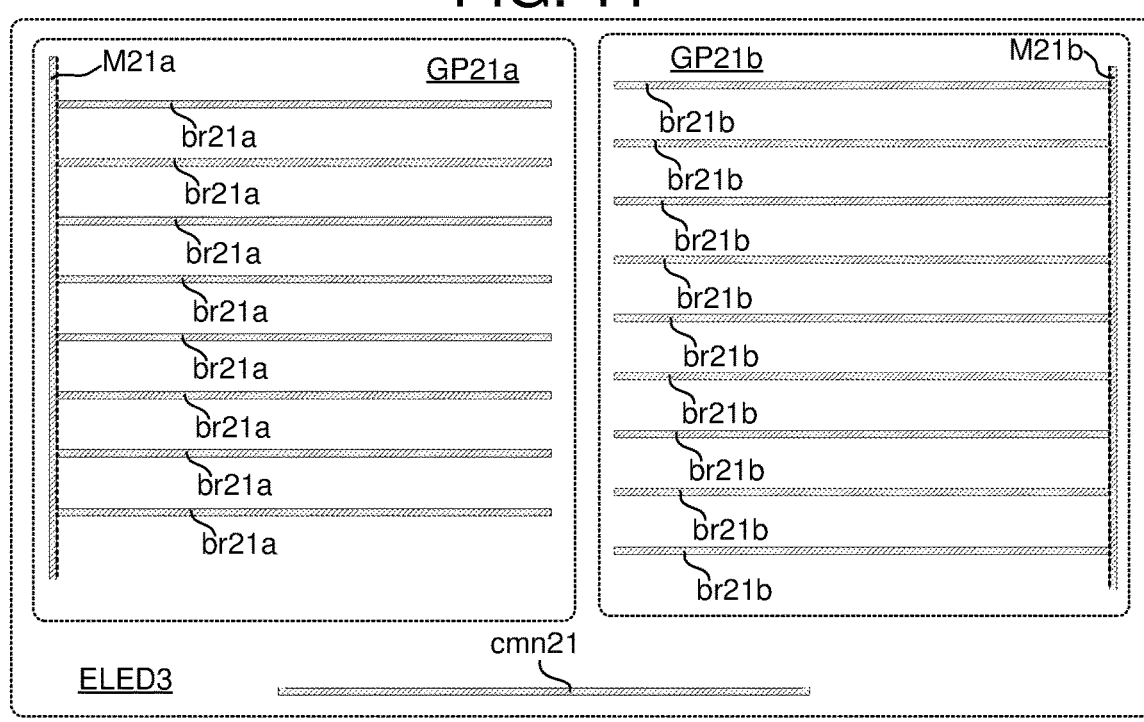
FIG. 12 is a schematic diagram illustrating the components of the electrode pattern of the electrode sheet ELED3.
Figure 13:
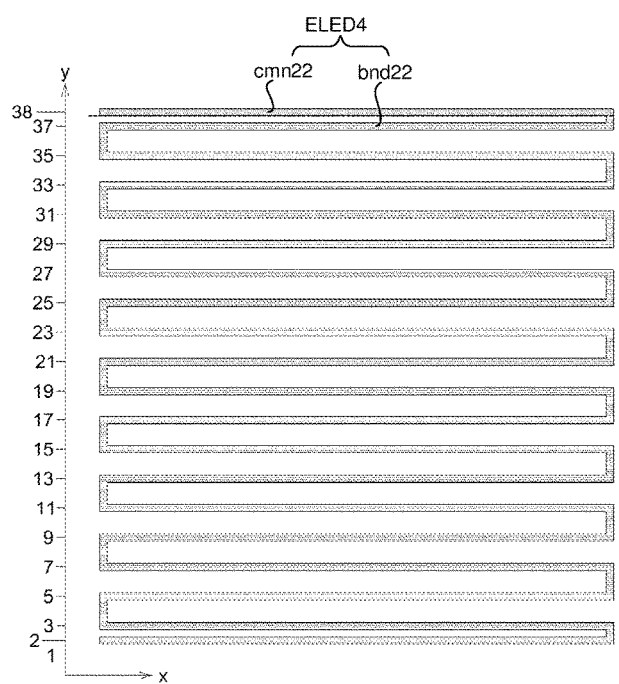
FIG. 13 is a schematic diagram illustrating the configuration of the electrode sheet ELED4.
Figure 14:
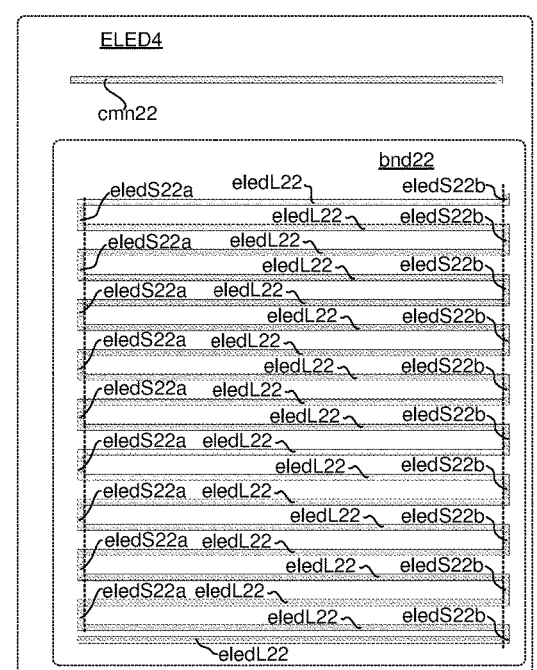
FIG. 14 is a schematic diagram illustrating the components of the electrode pattern of the electrode sheet ELED4.
Figure 15:
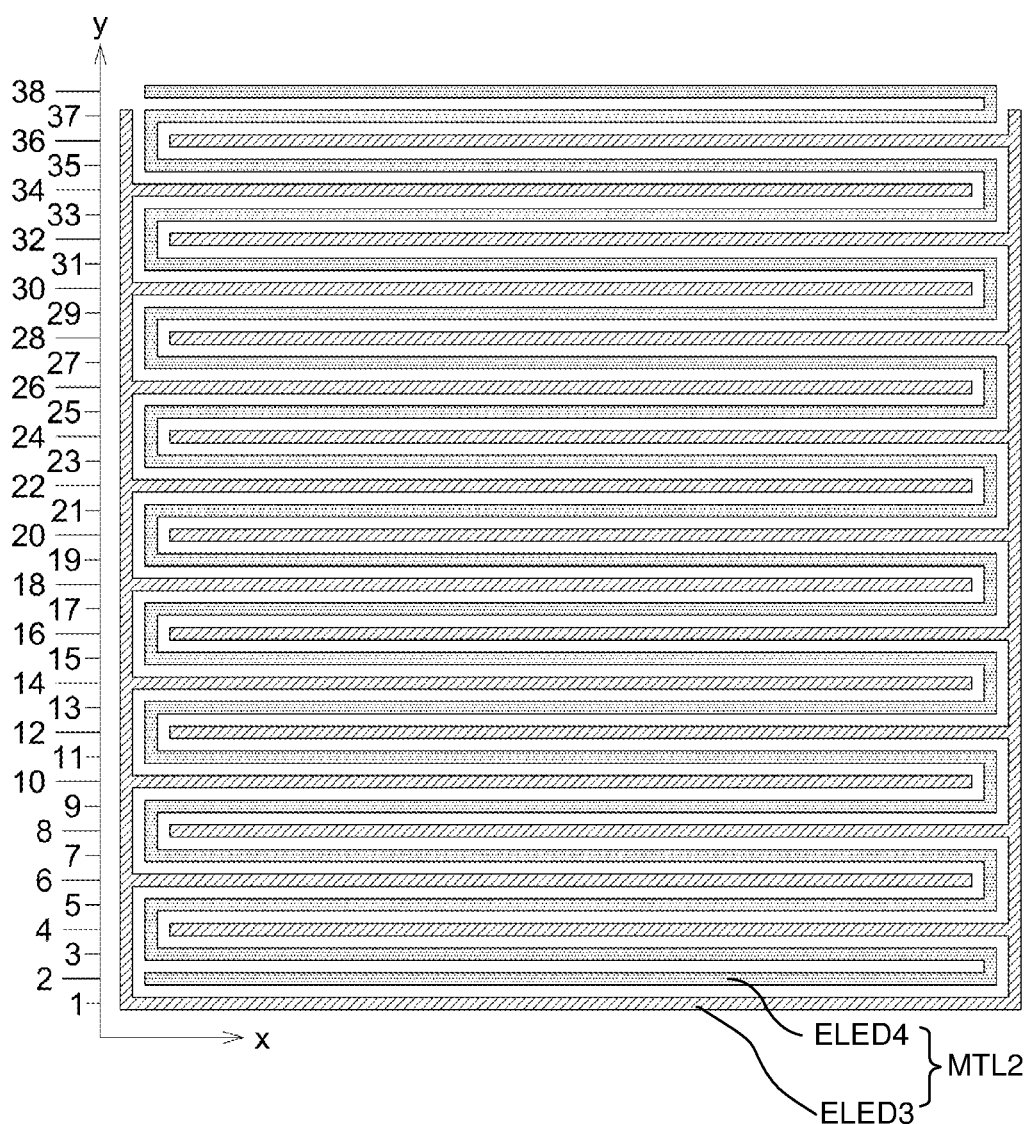
FIG. 15 is a schematic diagram illustrating that the electrode sheet ELED3 in FIG. 11 and the electrode sheet ELED4 in FIG. 13 are combined to provide the metal layer MTL2.

In the following description, FIGS. 11 and 12 illustrate the electrode pattern of the electrode sheet ELED3; FIGS. 13 and 14 illustrate the electrode pattern of the electrode sheet ELED4; and FIG. 15 illustrates the electrode pattern on the metal layer MTL2 after combining the electrode sheets ELED3 and ELED4 together.

Please refer to FIG. 11, which is a schematic diagram illustrating the configuration of the electrode sheet ELED3. The electrode sheet ELED3 includes a common electrode cmn21 and electrode sets GP21a and GP21b. The electrode sheet ELED3 is directly connected to both of the electrode sets GP21a and GP21b.

Please refer to FIG. 12, which is a schematic diagram illustrating the components of the electrode pattern of the electrode sheet ELED3. The electrode set GP21a is shown at the left side, the electrode set GP21b is shown at the right side, and the common electrode cmn21 is shown at the bottom.

The electrode set GP21a includes: a main electrode M21a parallel to the y-axis and connected to the common electrode cmn21 and a plurality of branch electrodes br21a parallel to the x-axis. The branch electrodes br21a are of equal length and connected to the main electrode M21a with the left ends. The right ends of the branch electrodes br21a extend toward the positive x-axis. The electrode set GP21b includes: a main electrode M21b parallel to the y-axis and connected to the common electrode cmn21, and a plurality of branch electrodes br21b parallel to the x-axis. The branch electrodes br21b are of equal length and connected to the main electrode M21b with the right ends. The left ends of the branch electrodes br21b extend toward the negative x-axis. Therefore, each of the electrode sets GP21a and GP21b has the shape of a flat comb. The teeth of the electrode set GP21a extend toward the positive x-axis, and the teeth of the electrode set GP21b extend toward the negative x-axis.

The common electrode cmn21 is parallel to the x-axis, and two ends of the common electrode cmn21 are connected to the bottoms of the main electrodes M21a and M21b, respectively. The common electrode cmn21 is longer than the branch electrodes br21a of the electrode set GP21a and is also longer than the branch electrodes br21b of the electrode set GP21b.

Please refer to both FIG. 11 and FIG. 12. In the electrode sheet ELED3, the branch electrodes br21a and the branch electrodes br21b are arranged at different row positions and interleaved in an alternate manner. When the metal layer MTL2 includes 38 row electrodes in total, the electrode set GP21a includes 8 branch electrodes br21a, and the electrode set GP21b includes 9 branch electrodes br21b. The common electrode cmn21 is arranged at the first row (y=1); the branch electrodes br21a are arranged from the 6th row at 4-row intervals (y=6, 10, . . . 34); and the branch electrodes br21b are arranged from the 4th row at 4-row intervals (y=4, 8, . . . 36).

Please refer to FIG. 13, which is a schematic diagram illustrating the configuration of the electrode sheet ELED4. The electrode sheet ELED4 includes a common electrode cmn22 and a bent electrode bnd22. The common electrode cmn22 is parallel to the x-axis, and the bent electrode bnd22 is zigzag-shaped (like an upright square wave).

Please refer to FIG. 14, which is a schematic diagram illustrating the components of the electrode pattern of the electrode sheet ELED4. The common electrode cmn22 is shown at the top, and the bent electrode bnd22 is shown at the lower portion.

The common electrode cmn22 is parallel to the x-axis and has a length slightly longer than the bent electrode bnd22 along the x-axis. The bent electrode bnd22 includes a plurality of long electrodes eledL22 and a plurality of short electrodes eledS22a and eledS22b. The long electrodes eledL22 are of equal length and parallel to the x-axis, while the left ends of the long electrodes eledL22 are aligned with a straight line, and the right ends of the long electrodes eledL22 are aligned with another straight line. As shown in FIG. 13, the long electrodes eledL22 are arranged in the second row, the 38th row, and the odd-numbered rows are falling between the second row and the 38th row (y=3, 5, . . . 37).

Please refer to both FIG. 13 and FIG. 14. The short electrodes eledS22a and eledS22b of the bent electrode bnd22 are parallel to the y-axis. Each of the short electrodes eledS22a and eledS22b has a head end and a tail end. The short electrodes eledS22a are connected to the left ends of the long electrodes eledL22 with the head ends, and the tail ends, and the short electrodes eledS22b are connected to the right ends of the long electrodes eledL22 with the head ends and the tail ends. Further, the left end and the right end of one long electrode eledL22 are connected to one short electrode eledS22a and one short electrode eledS22b extending toward opposite directions along the y-axis.

For example, the right ends of the long electrodes eledL12 arranged in the second row, and the third row are connected to two ends of the short electrodes eledS22b arranged at the right side, respectively. Similarly, the left ends of the long electrodes eledL22 arranged at the third row and the 5th row are connected to two ends of the short electrodes eledS22a arranged at the left side, respectively. Similarly, the right ends of the long electrodes eledL12 arranged at the 5th row, and the 7th row are connected to two ends of the right-side short electrodes eledS22b, respectively. Similarly, the left ends of the long electrodes eledL22 arranged at the 7th row, and the 9th row are connected to two ends of the left-side short electrodes eledS22a, respectively. Other connection relations of the long electrodes eledL22 and the short electrodes eledS22a and eledS22b could be derived in a similar manner and are not particularly described herein.

That is to say, the positions of the left-side short electrodes eledS22a and the right-side short electrodes eledS22b are alternate along the y-axis. Besides, the right-side short electrodes eledS22b connected to the long electrode eledL22 arranged at the 37th row is connected to the common electrode cmn22 with the head end.

Please refer to FIG. 15, which is a schematic diagram illustrating that the electrode sheet ELED3 in FIG. 11 and the electrode sheet ELED4 in FIG. 13 are combined to provide the metal layer MTL2. The electrode sheet ELED3 in FIG. 11 and the electrode sheet ELED4 in FIG. 13 collectively constitute the metal layer MTL2 in FIG. 15. The electrode positions of the electrode sheets ELED3 and ELED4 of the metal layer MTL2, as illustrated in FIGS. 11, 13, and 15 are listed in Table 2.

TABLE 2

| Metal layer MTL2 | Electrode type | | Direction | Row number of the electrode |
|---|---|---|---|---|
| Electrode sheet ELED3 (FIGS. 11, 12) | Electrode set GP21a | Main electrode M21a | y-axis | NA |
| | | Branch electrode br21a | x-axis | 6, 10, 14, 18, 22, 26, 30, 34 |
| | Electrode set GP21b | Main electrode M21b | y-axis | NA |
| | | Branch electrode br21b | x-axis | 4, 8, 12, 16, 20, 24, 28, 32, 36 |
| | Common electrode cmn21 | | x-axis | 1 |
| Electrode sheet ELED4 (FIGS. 13, 14) | Common electrode cmn22 | | x-axis | 38 |
| | Bent electrode bnd22 | Long electrode eledL22 | x-axis | 2, 3, 5, 7, 9, 11, 13, 15, 17, 19, 21, 23, 25, 27, 29, 31, 33, 35, 37 |
| | | Short electrode eledS22a, eledS22b | y-axis | NA |

From Table 2, it is shown that the branch electrodes br21a and br21b of the electrode sheet ELED3 receiving the voltage V1 are mainly arranged at the even-numbered rows, and the long electrodes eledL22 of the electrode sheet ELED4 receiving the voltage V2 are mainly arranged at the odd-numbered rows. Therefore, the adjacent row electrodes of the metal layer MTL2 can form the coplanar capacitors Ch2.

As described above, such design of the electrode patterns can have the metal layers MTL1 and MTL2 themselves to form the coplanar capacitors Ch1 and Ch2. In addition, the metal layers MTL1 and MTL2 also form the inter-layer capacitors Cv1 and Cv2.

Please refer to FIGS. 6, 7, 13, and 14, along with Tables 1 and 2. As listed in Table 1, in FIGS. 6 and 7, the branch electrodes br11a of the electrode sheet ELED1 are arranged at the third, 7th, 11th, 15th, 19th, 23rd, 27th, 31st, and 35th rows; and the branch electrodes br11b of the electrode sheet ELED1 are arranged at the 5th, 9th, 13th, 17th, 21st, 25th, 29th, 33rd, and 37th rows. As listed in Table 2, in FIGS. 13 and 14, the long electrodes eledL22 of the bent electrode bnd22 of the electrode sheet ELED4 are arranged at the second row and all odd-numbered rows between the third row and the 37th row. Since the metal layer MTL2 is disposed above the metal layer MTL1, it is shown that the long electrodes eledL22 of the electrode sheet ELED4 are mainly disposed above the branch electrodes br11a of the electrode sheet ELED1. In addition, the electrode sheet ELED1 receives the voltage V1 and the electrode sheet ELED4 receives the voltage V2. Accordingly, when the metal layer MTL2 in FIG. 15 is disposed right above the metal layer MTL1 in FIG. 10, the two metal layers MTL1 and MTL2 collectively form the inter-layer capacitors Cv1 within the region corresponding to all of the odd-numbered rows between the third row and the 37th row.

Please refer to FIGS. 8, 9, 11, and 12, along with Tables 1 and 2. As listed in Table 1, in FIGS. 8 and 9, the long electrodes eledL12 of the bent electrode bnd12 of the electrode sheet ELED2 are arranged at the even-numbered rows (y=2, 4, 6, 8, 10, 12, 14, 16, 18, 20, 22, 24, 26, 28, 30, 32, 34 and 36). As listed in Table 2, in FIGS. 11 and 12, the branch electrodes br21a of the electrode sheet ELED3 are arranged at the 6th, 10th, 14th, 18th, 22nd, 26th, 30th and 34th rows; and the branch electrodes br21b of the electrode sheet ELED3 are arranged at the 4th, 8th, 12th, 16th, 20th, 24th, 28th, 32nd, and 36th rows. Since the metal layer MTL2 is disposed above the metal layer MTL1, it is shown that the branch electrodes br21a and br21b of the electrode sheet ELED3 are completely disposed above the long electrodes eledL12 of the electrode sheet ELED2. In addition, the electrode sheet ELED2 receives the voltage V2 and the electrode sheet ELED3 receives the voltage V1. Accordingly, when the metal layer MTL2 in FIG. 15 is disposed right above the metal layer MTL1 in FIG. 10, the two metal layers MTL1 and MTL2 collectively form the inter-layer capacitors Cv2 within the region corresponding to all of the even-numbered rows.

Figure 16:
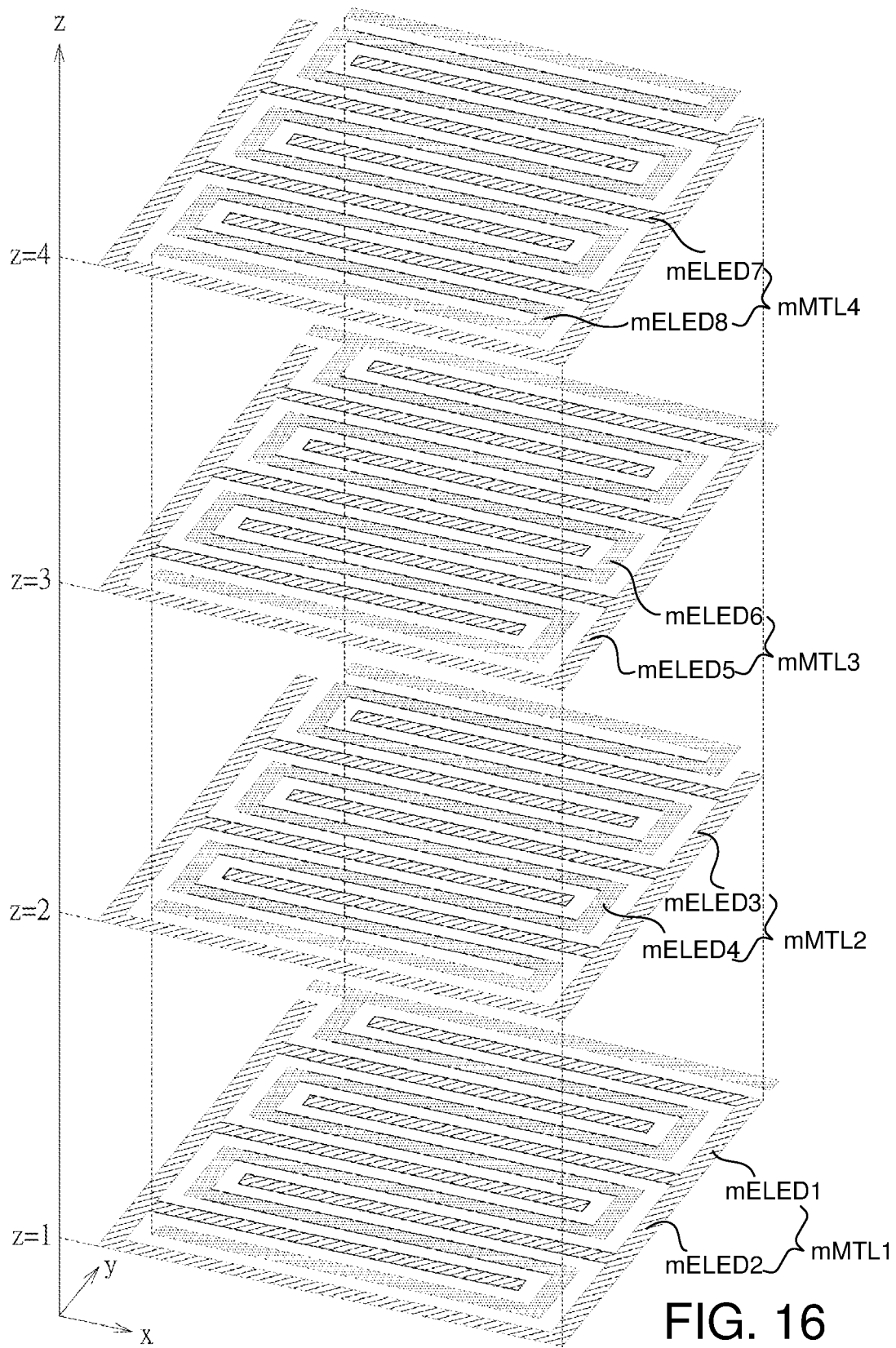
FIG. 16 is a schematic diagram illustrating that the electrode patterns on the multiple metal layers are arranged in an alternate manner.

The concepts of the metal layers and the electrode sheets described above may be applied to more metal layers. FIG. 16 illustrates an example of four metal layers. In practice, the number of metal layers depends on the layer number related to the semiconductor process.

Please refer to FIG. 16, which is a schematic diagram illustrating that the electrode patterns on the multiple metal layers are arranged in an alternate manner. For illustration purposes, the electrode positions in the electrode patterns of the electrode sheets mELED1, mELED2, mELED3, mELED4, mELED5, mELED6, mELED7 and mELED8 of the metal layers mMTL1, mMTL2, mMTL3, and mMTL4 are listed in Table 3.

TABLE 3

| | | Voltage | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|---|
| Metal layer mMTL1 | Electrode sheet mELED1 | V1 | X | | X | | X | | X | | X | | X | | X | |
| | Electrode sheet mELED2 | V2 | | X | X | | X | | X | | X | | X | | X | X |
| Metal layer mMTL2 | Electrode sheet mELED3 | V1 | X | | | X | X | | X | X | | X | X | | | |
| | Electrode sheet mELED4 | V2 | | X | X | | X | | X | | X | | X | | X | X |
| Metal layer mMTL3 | Electrode sheet mELED5 | V1 | X | | X | | X | | X | | X | | X | | X | |
| | Electrode sheet mELED6 | V2 | | X | | X | | X | | X | | X | | X | | X |
| Metal layer mMTL4 | Electrode sheet mELED7 | V1 | X | | | X | | X | | X | | X | | X | | |
| | Electrode sheet mELED8 | V2 | | X | X | | X | | X | | X | | X | | X | X |

As described above, the electrode sheets of different metal layers collectively form the inter-layer capacitors, and the electrode sheets of each single metal layer collectively form the coplanar capacitor. Therefore, according to the design of the electrode patterns, as shown in FIG. 16, the electrode sheets mELED1 and mELED2 of the metal layer mMTL1 collectively form the coplanar capacitor Ch; the electrode sheets mELED3 and mELED4 of the metal layer mMTL2 collectively form the coplanar capacitor Ch; the electrode sheets mELED5 and mELED6 of the metal layer mMTL3 collectively form the coplanar capacitor Ch, and the electrode sheets mELED7 and mELED8 of the metal layer mMTL4 collectively form the coplanar capacitor Ch. In addition, the metal layers mMTL1 and mMTL2 collectively form the inter-layer capacitors Cv; the metal layers mMTL2 and mMTL3 collectively form the inter-layer capacitors Cv, and the metal layers mMTL3 and mMTL4 collectively form the inter-layer capacitors Cv.

In the above embodiments, the electrode sheets receiving the voltage V1 have a similar configuration, and the electrode sheets receiving the voltage V2 have a similar configuration. For example, both the electrode sheet ELED1 of the metal layer MTL1 and the electrode sheet ELED3 of the metal layer MTL2 receive the voltage V1 and each of which includes a common electrode arranged at the first row and electrode sets. Similarly, both the electrode sheet ELED2 of the metal layer MTL1 and the electrode sheet ELED4 of the metal layer MTL2 receive the voltage V2 and each of which includes a common electrode and a bent electrode. In practice, the condition of a similar configuration for a specific received voltage is not necessary. For example, in the embodiment with reference to FIG. 17, the electrode sheets respectively belonging to adjacent metal layers and receiving the same voltage have different electrode patterns.

Figure 17:
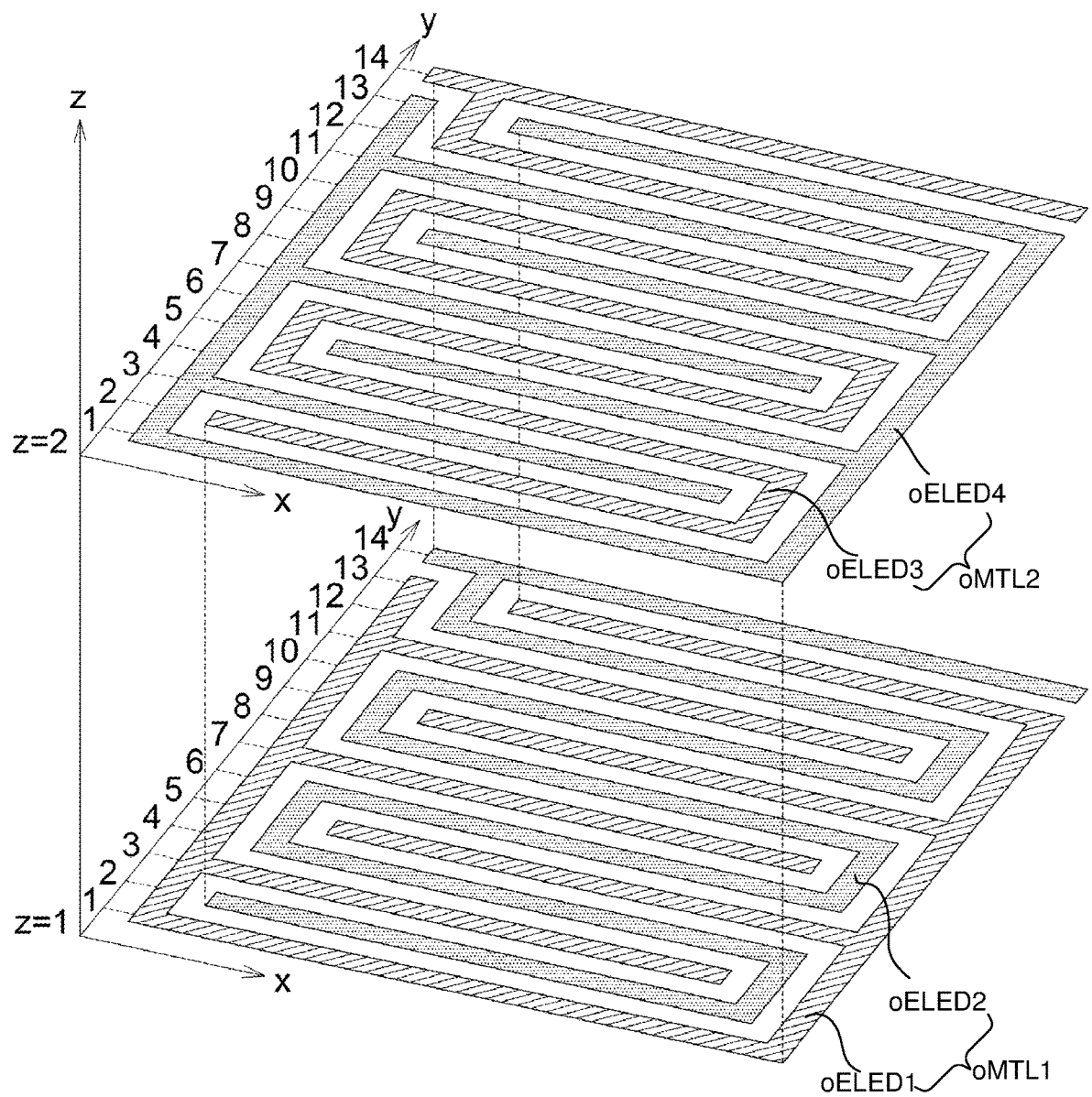
FIG. 17 is a schematic diagram illustrating that the capacitance effect between electrode sheets of two metal layers occurs based on the electrode patterns of the electrode sheets according to another embodiment of the present disclosure.

Please refer to FIG. 17, which is a schematic diagram illustrating that the capacitance effect between electrode sheets of two metal layers occurs based on the electrode patterns of the electrode sheets according to another embodiment of the present disclosure. For illustration purposes, the electrode positions in the electrode patterns of the electrode sheets oELED1, oELED2, oELED3, and oELED4 of the metal layers oMTL1 and oMTL2 are listed in Table 4.

TABLE 4

| | | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| Metal layer oMTL1 | Electrode sheet oELED1(V1) | X | | X | | X | | X | | X | | X | | X | |
| | Electrode sheet oELED2(V2) | | X | | X | | X | | X | | X | | X | | X |
| Metal layer oMTL2 | Electrode sheet oELED3(V1) | X | | X | | X | | X | | X | | X | | X | |
| | Electrode sheet oELED4(V2) | | X | | X | | X | | X | | X | | X | | X |

The electrode patterns and the relative positions of the electrodes of the electrode sheets oELED3 and oELED4 of the metal layer oMTL2 in FIG. 17 are slightly different from those in FIG. 4. According to the design of the electrode patterns in FIG. 17, each of the electrode sheets oELED1, oELED2, oELED3, and oELED4 receives the corresponding voltage V1 or V2, as shown in FIG. 4. In other words, in the metal layer oMTL1, the electrode sheet oELED1 receives the voltage V1, and the electrode sheet oELED2 receives the voltage V2. On the other hand, in the metal layer oMTL2, the electrode sheet oELED4 receives the voltage V2, and the electrode sheet oELED3 receives the voltage V1. Therefore, the details about the inter-layer capacitors Cv formed by the electrode sheets of separate metal layers and the coplanar capacitors Ch formed by the separate electrode sheets of the single metal layer are as described in the above embodiments.

In FIG. 17, the electrode pattern of the electrode sheet oELED1 resembles the electrode pattern of the electrode sheet oELED4, while the electrode pattern of the electrode sheet oELED2 resembles the electrode pattern of the electrode sheet ELED3. In other words, the electrode sheet oELED1 of the metal layer oMTL1 receiving the voltage V1 has a similar configuration to the electrode sheet oELED4 of the metal layer oMTL2 receiving the voltage V2. On the other hand, the electrode sheet oELED2 of the metal layer oMTL1 receiving the voltage V2 has a similar configuration to the electrode sheet oELED3 of the metal layer oMTL2 receiving the voltage V1.

The electrode patterns of the present disclosure could be further modified. For example, the electrode patterns could have more sections along the x-axis. The quantities of the bent electrodes and the electrode sets could be adjusted according to the number of the sections. The arrangement of the electrodes should be adjusted according to the quantities of the bent electrodes and the electrode sets. The following description explains the electrode sheets with multiple sections in one metal layer. In practice, the configuration of the electrode sheets of other metal layers should be modified correspondingly. The related design of the electrode patterns of the metal layers is not given verbosely.

Figure 18:
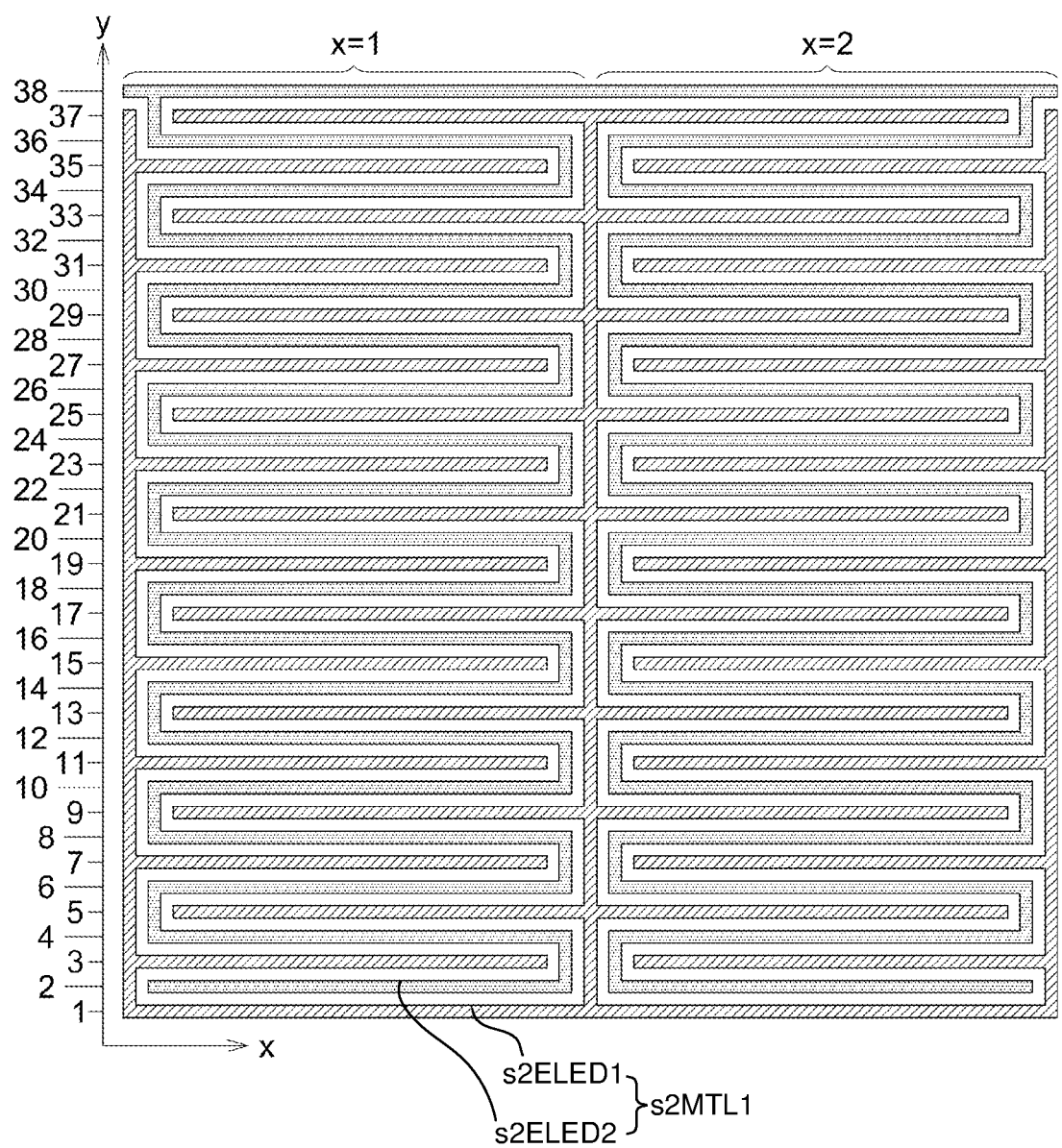
FIG. 18 is a schematic diagram illustrating that the electrode sheets of the metal layer s2MTL1 include two sections according to a further embodiment of the present disclosure.
Figure 19:
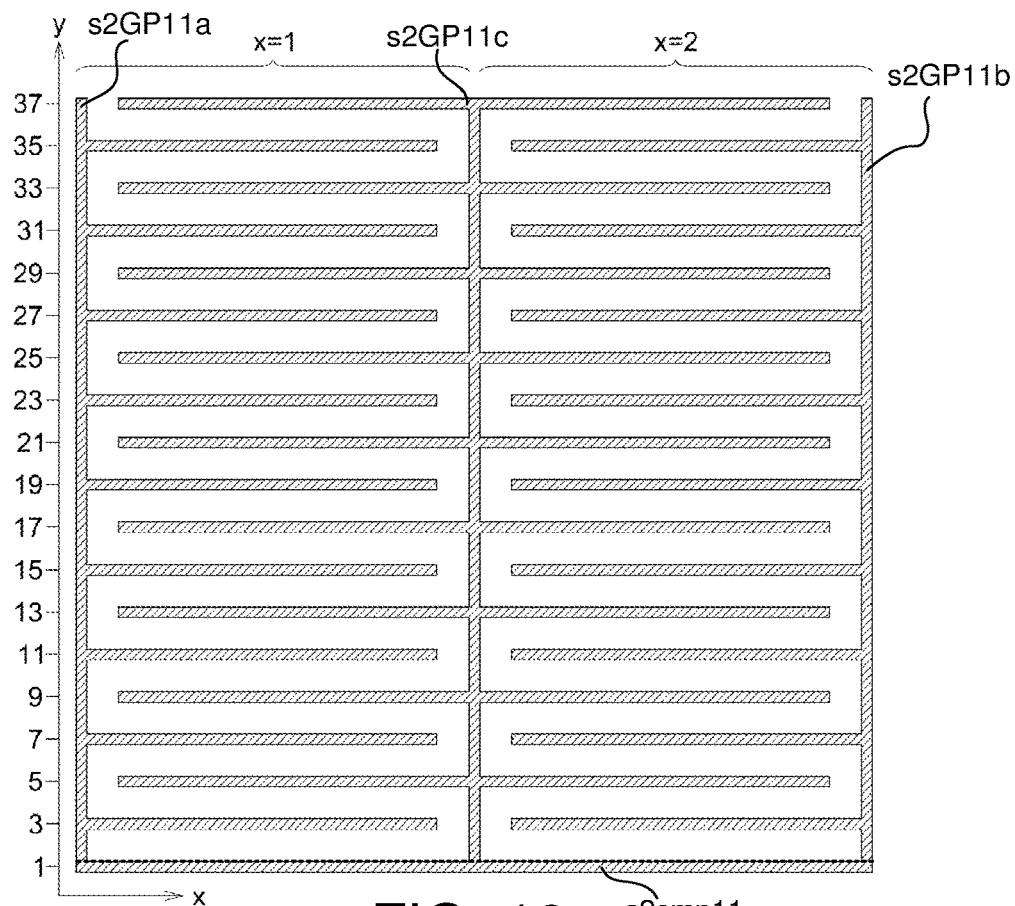
FIG. 19 is a schematic diagram illustrating the configuration of the electrode sheet s2ELED1 in FIG. 18.
Figure 20:
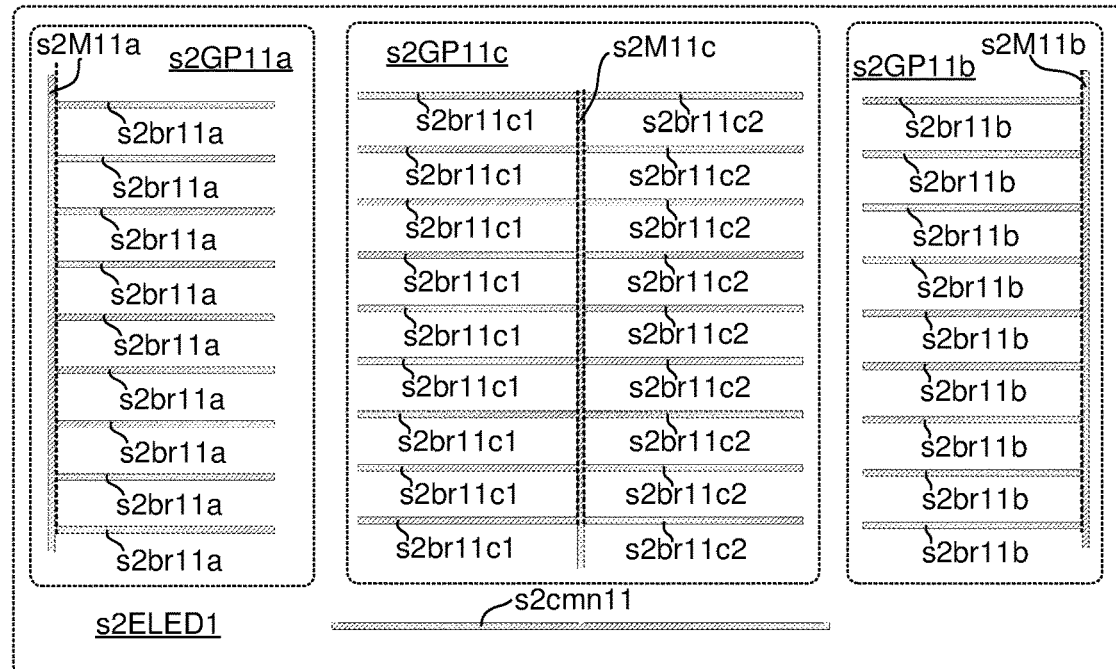
FIG. 20 is a schematic diagram illustrating the components of the electrode pattern of the electrode sheet s2ELED1 in FIG. 18.
Figure 21:
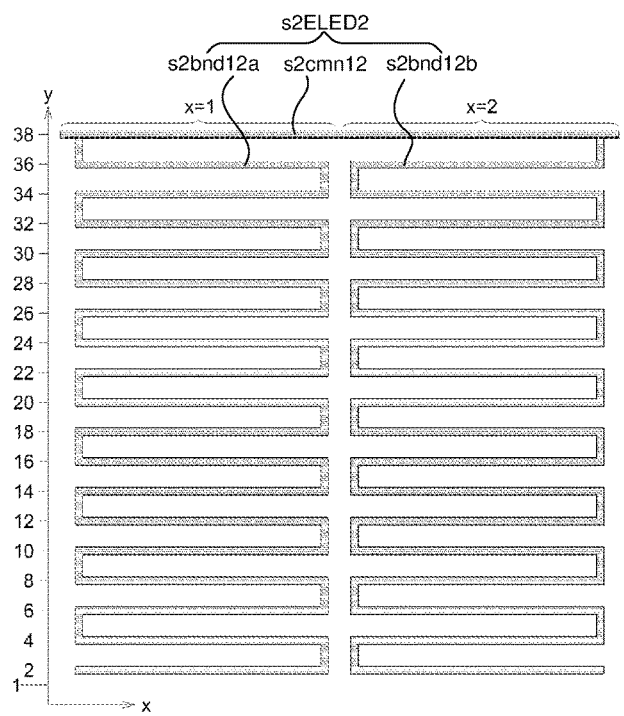
FIG. 21 is a schematic diagram illustrating the configuration of the electrode sheet s2ELED2 in FIG. 18.
Figure 22:
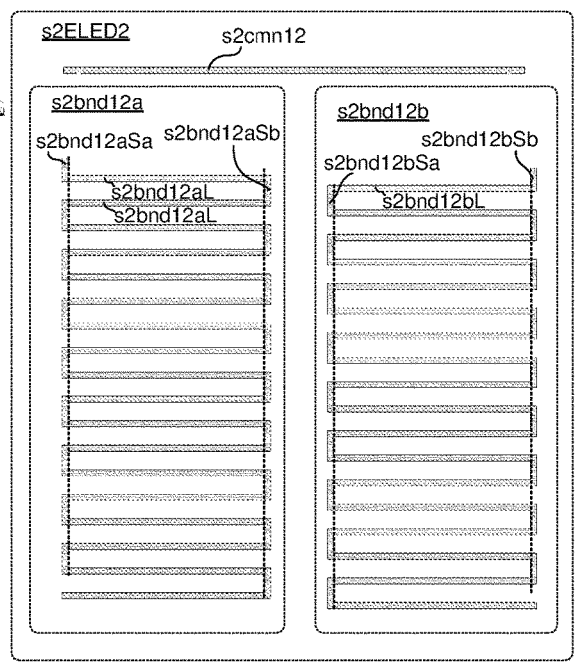
FIG. 22 is a schematic diagram illustrating the components of the electrode pattern of the electrode sheet s2ELED2 in FIG. 18.

Please refer to FIG. 18, which is a schematic diagram illustrating that the electrode sheets of the metal layer s2MTL1 include two sections according to a further embodiment of the present disclosure. The metal layer s2MTL1 includes electrode sheets s2ELED1, and s2ELED2. FIGS. 19 and 20 illustrate the configuration of the electrode sheet s2ELED1, and FIGS. 21 and 22 illustrate the configuration of the electrode sheet s2ELED2.

Please refer to FIG. 19, which is a schematic diagram illustrating the configuration of the electrode sheet s2ELED1 in FIG. 18. The electrode sheet s2ELED1 includes a common electrode s2cmn11 and electrode sets s2GP11a, s2GP11b and s2GP11c. The common electrode s2cmn11 is directly connected to the electrode sets s2GP11a, s2GP11b and s2GP11c.

Please refer to FIG. 20, which is a schematic diagram illustrating the components of the electrode pattern of the electrode sheet s2ELED1 in FIG. 18. The electrode set s2GP11a includes a main electrode s2M11a and a plurality of branch electrodes s2br11a; the electrode set s2GP11 includes a main electrode s2M11b and a plurality of branch electrodes s2br11b, and the electrode set s2GP11c includes a main electrode s2M11c and a plurality of branch electrodes s2br11c1 and s2br11c2. The main electrodes s2M11a, s2M11b and s2M11c are parallel to the y-axis; and the branch electrodes s2br11a, s2br11b, s2br11c1 and s2br11c2 are parallel to the x-axis.

Each of the electrode sets s2GP11a and s2GP11b has the shape of a flat comb. Their components are similar to those of the electrode sets GP11a and GP11b in FIG. 7, and similar details are not given herein. In addition, the electrode set s2GP11c has the shape of a fishbone. The branch electrodes s2br11c1 and s2br11c2 of the electrode set s2GP11c are arranged at opposite sides of the main electrode s2M11c, respectively. Therefore, the electrode set s2GP11c includes more branch electrodes (s2br11c1 and s2br11c2) than each of the electrode set s2GP11a (including branch electrodes s2br11a) and s2GP11b (including branch electrodes s2br11b). Furthermore, the common electrode s2cmn11 is parallel to the x-axis. Two ends of the common electrode s2cmn11 are connected to the main electrodes s2M11a and s2M11b, respectively, and the middle part of the common electrode s2cmn11 is connected to the main electrode s2M11c.

Please refer to FIG. 21, which is a schematic diagram illustrating the configuration of the electrode sheet s2ELED2 in FIG. 18. The electrode sheet s2ELED2 includes a common electrode s2cmn12 and bent electrodes s2bnd12a and s2bnd12b.

Please refer to FIG. 22, which is a schematic diagram illustrating the components of the electrode pattern of the electrode sheet s2ELED2 in FIG. 18. The common electrode s2cmn12 is parallel to the x-axis. The electrode sheet s2ELED2 has mirror symmetry because the bent electrodes s2bnd12a and s2bnd12b are symmetric to each other. The long electrodes s2bnd12aL of the bent electrode s2bnd12a and the long electrodes s2bnd12bL of the bent electrode s2bnd12b are equal in quantity and size; the short electrodes s2bnd12aSa of the bent electrode s2bnd12a and the short electrodes s2bnd12bSb of the bent electrode s2bnd12b are equal in quantity and size; and the short electrodes s2bnd12aSb of the bent electrode s2bnd12a and the short electrodes s2bnd12bSa of the bent electrode s2bnd12b are equal in quantity and size.

FIG. 18 illustrates the metal layer s2MTL1 obtained by combining the electrode sheet s2ELED1 in FIG. 19 and the electrode sheet s2ELED2 in FIG. 21 together. The main electrode s2M11c divides the metal layer s2MTL1 into two sections. The electrode pattern of the electrode sheet s2ELED1 has mirror symmetry wherein two portions respectively at x=1, and x=2 are symmetric to each other. Similarly, the electrode pattern of the electrode sheet s2ELED2 has mirror symmetry wherein two sections at x=1 and x=2 are symmetric to each other.

Figure 23:
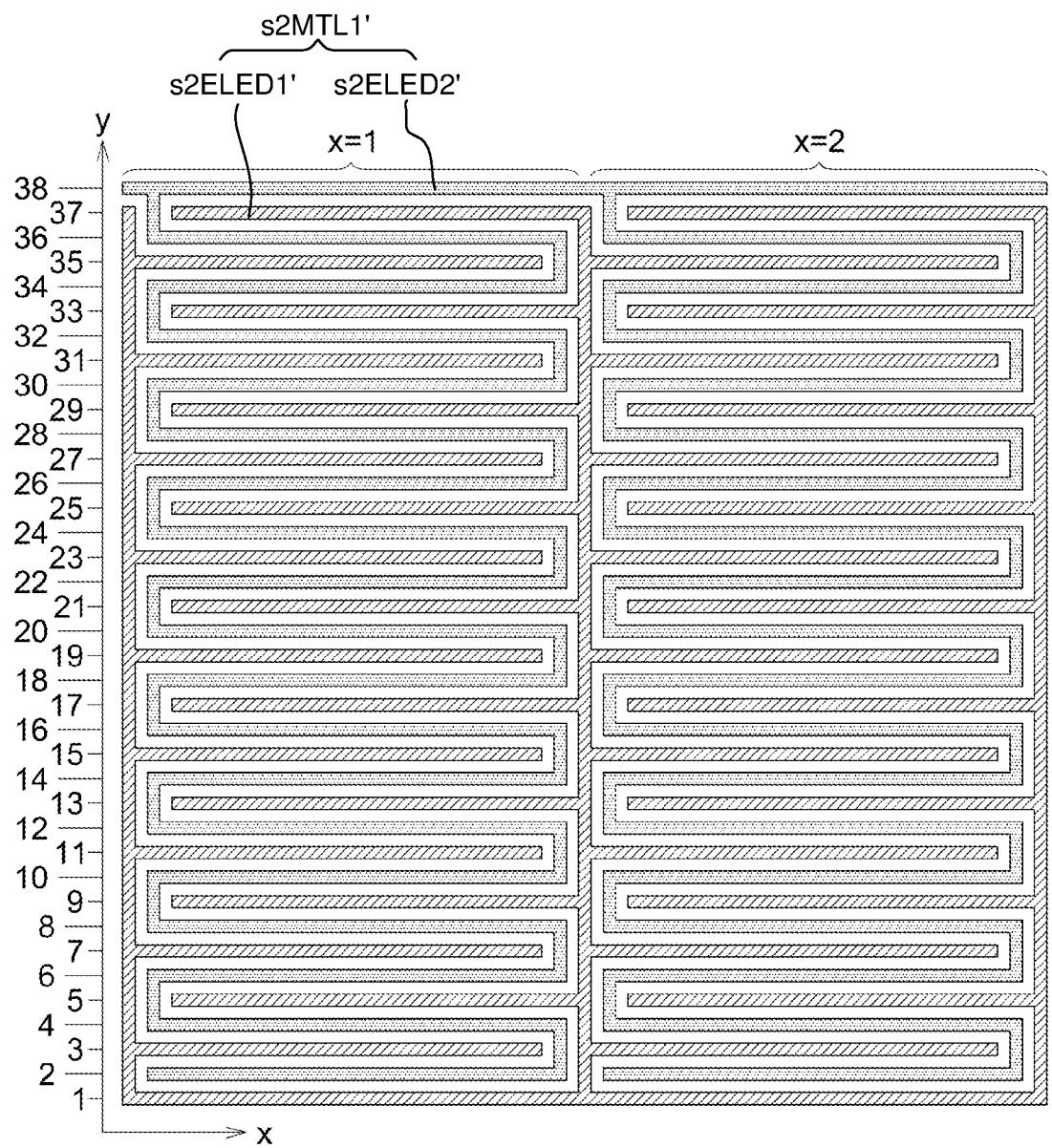
FIG. 23 is a schematic diagram illustrating that the electrode sheets of the metal layer s2MTL1' includes two sections according to a further embodiment of the present disclosure.
Figure 24:
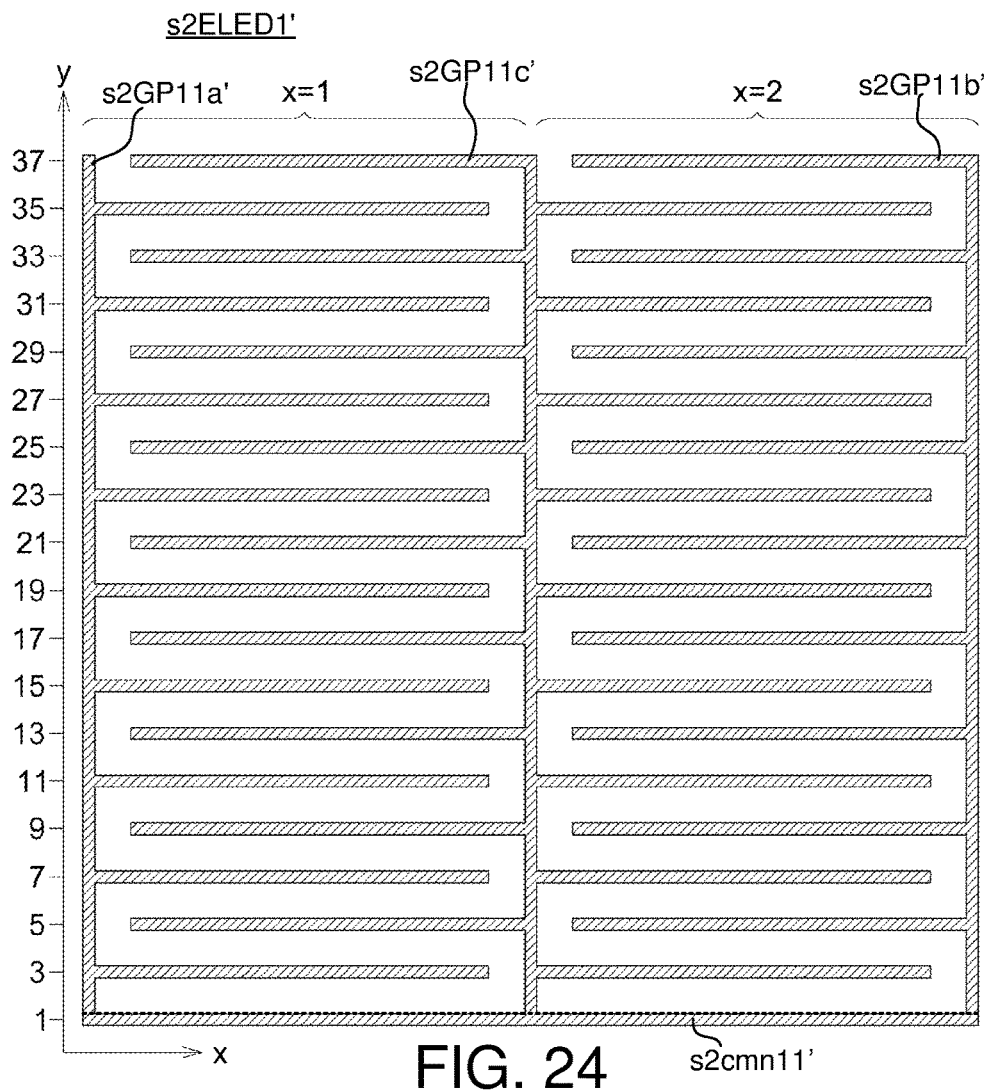
FIG. 24 is a schematic diagram illustrating the configuration of the electrode sheet s2ELED1' in FIG. 23.
Figure 25:
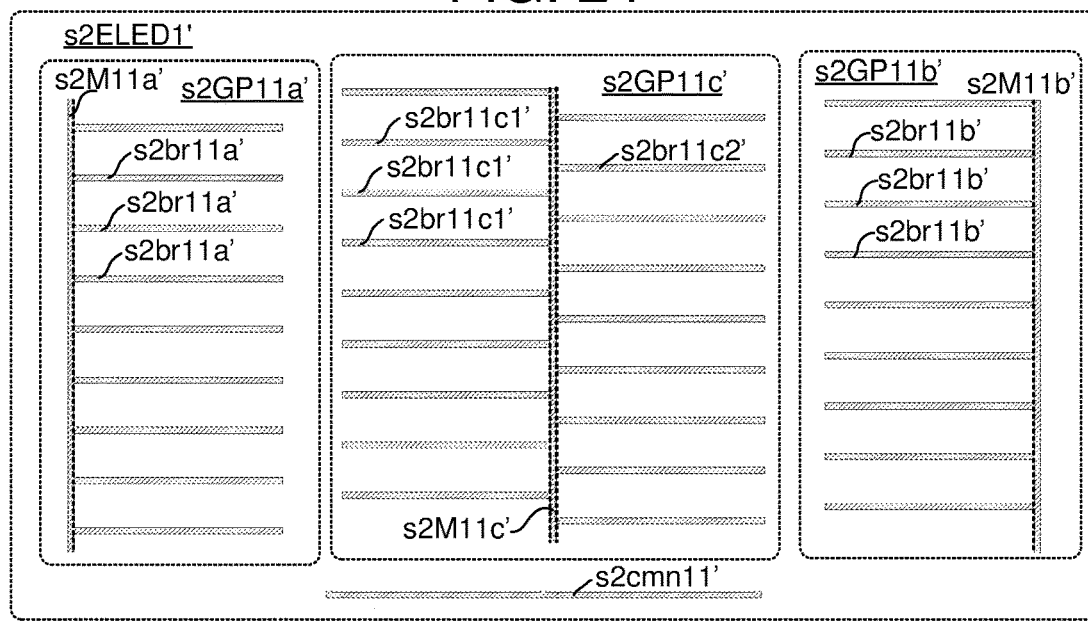
FIG. 25 is a schematic diagram illustrating the components of the electrode pattern of the electrode sheet s2ELED1' in FIG. 23.
Figure 26:
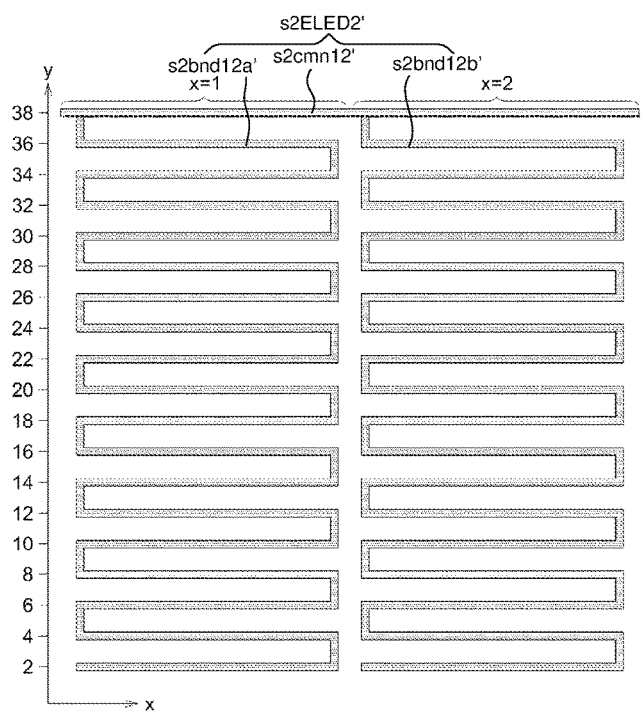
FIG. 26 is a schematic diagram illustrating the configuration of the electrode sheet s2ELED2' in FIG. 23.
Figure 27:
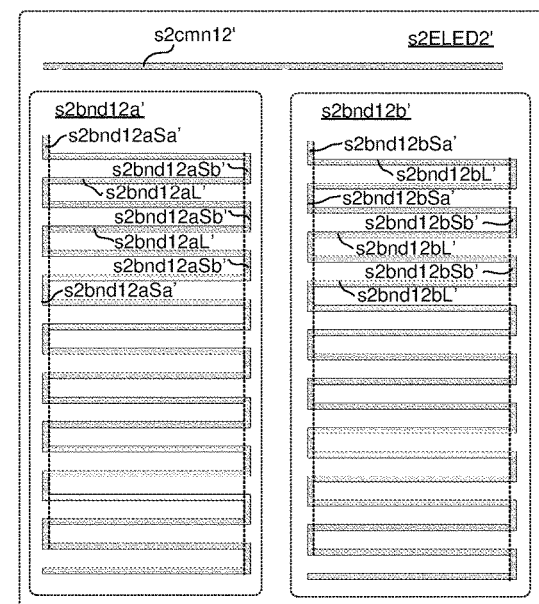
FIG. 27 is a schematic diagram illustrating the components of the electrode pattern of the electrode sheet s2ELED2' in FIG. 23.

Please refer to FIG. 23, which is a schematic diagram illustrating that the electrode sheets of the metal layer s2MTL1' include two sections according to a further embodiment of the present disclosure. The metal layer s2MTL1' includes electrode sheets s2ELED1' and s2ELED2'. FIGS. 24 and 25 illustrate the configuration of the electrode sheet s2ELED1', and FIGS. 26 and 27 illustrate the configuration of the electrode sheet s2ELED2'.

Please refer to FIG. 24, which is a schematic diagram illustrating the configuration of the electrode sheet s2ELED1' in FIG. 23. The electrode sheet s2ELED1' includes a common electrode s2cmn11' and electrode set s2GP11a', s2GP11b' and s2GP11c'.

Please refer to FIG. 25, which is a schematic diagram illustrating the components of the electrode pattern of the electrode sheet s2ELED1' in FIG. 23. The electrode set s2GP11a' includes a main electrode s2M11a' and a plurality of branch electrodes s2br11a'; the electrode set s2GP11b' includes a main electrode s2M11b' and a plurality of branch electrodes s2br11b'; and the electrode set s2GP11c' includes a main electrode s2M11c' and a plurality of branch electrodes s2br11c1' and s2br11c2'. The main electrodes s2M11$a'$, s2M11$b'$ and s2M11$c'$ are parallel to the y-axis, and the branch electrodes s2$br$11$a'$, s2$br$11$b'$, s2$br$11$c$1$'$ and s2$br$11$c$2$'$ are parallel to the x-axis.

Each of the electrode sets s2GP11$a'$ and s2GP11$b'$ has the shape of a flat comb. Their components are similar to those of the electrode sets GP21$a$ and GP21$b$ in FIG. 11, and similar details are not given herein. In addition, the electrode set s2GP11$c'$ has the shape of a fishbone. The branch electrodes s2$br$11$c$1$'$ and s2$br$11$c$2$'$ of the electrode set s2GP11$c'$ are arranged at opposite sides of the main electrode s2M11$c'$, respectively. Therefore, the electrode set s2GP11$c'$ includes more branch electrodes (s2$br$11$c$1$'$ and s2$br$11$c$2$'$) than each of the electrode sets s2GP11$a'$ (including branch electrodes s2$br$11$a'$) and s2GP11$b'$ (including branch electrodes s2$br$11$b'$). Furthermore, the common electrode s2$cmn$11$'$ is parallel to the x-axis. Two ends of the common electrode s2$cmn$11$'$ are connected to the main electrodes s2M11$a'$ and s2M11$b'$, respectively, and the middle part of the common electrode s2$cmn$11$'$ is connected to the main electrode s2M11$c'$.

Please refer to FIG. 26, which is a schematic diagram illustrating the configuration of the electrode sheet s2ELED2$'$ in FIG. 23. The electrode sheet s2ELED2$'$ includes a common electrode s2$cmn$12$'$ and bent electrodes s2$bnd$12$a'$ and s2$bnd$12$b'$.

Please refer to FIG. 27, which is a schematic diagram illustrating the components of the electrode pattern of the electrode sheet s2ELED2$'$ in FIG. 23. The common electrode s2$cmn$12$'$ is parallel to the x-axis. The bent electrode s2$bnd$12$a'$ has an identical shape to the bent electrode s2$bnd$12$b'$, and the bent electrodes s2$bnd$12$a'$ and s2$bnd$12$b'$ are arranged side by side. The long electrodes s2$bnd$12$a$L$'$ of the bent electrode s2$bnd$12$a'$ and the long electrodes s2$bnd$12$b$L$'$ of the bent electrode s2$bnd$12$b'$ are equal in quantity and size; the short electrodes s2$bnd$12$a$Sa$'$ of the bent electrode s2$bnd$12$a'$ and the short electrodes s2$bnd$12$b$Sa$'$ of the bent electrode s2$bnd$12$b'$ are equal in quantity and size; and the short electrodes s2$bnd$12$a$Sb$'$ of the bent electrode s2$bnd$12$a'$ and the short electrodes s2$bnd$12$b$Sb$'$ of the bent electrode s2$bnd$12$b'$ are equal in quantity and size.

FIG. 23 illustrates the metal layer s2MTL1$'$ obtained by combining the electrode sheet s2ELED1$'$ in FIG. 24 and the electrode sheet s2ELED2$'$ in FIG. 26 together. The main electrode s2M11$c'$ divides the metal layer s2MTL1$'$ into two sections. In the electrode pattern of the electrode sheet s2ELED1$'$, the shape of one section at x=1 is identical to the shape of the other section at x=2. Similarly, in the electrode pattern of the electrode sheet s2ELED2$'$, the shape of one section at x=1 is identical to the shape of the other section at x=2.

Figure 28:
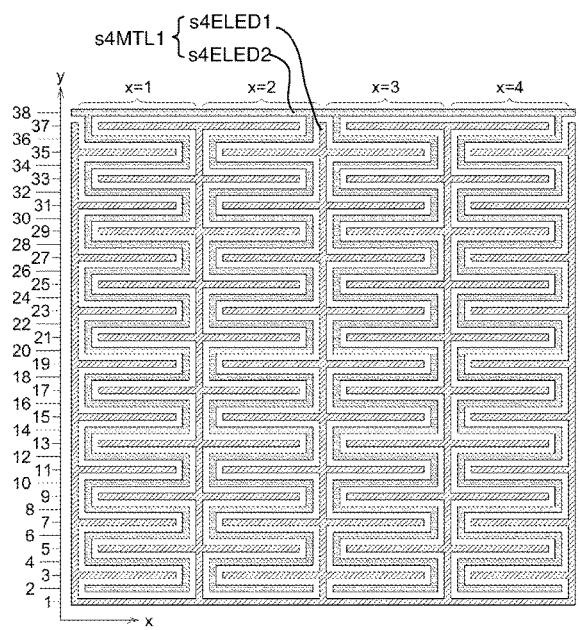
FIG. 28 is a schematic diagram illustrating that the electrode sheets of the metal layer s4MTL1 include four sections according to a further embodiment of the present disclosure.

Please refer to FIG. 28, which is a schematic diagram illustrating that the electrode sheets of the metal layer s4MTL1 include four sections according to a further embodiment of the present disclosure. The metal layer s4MTL1 includes electrode sheets s4ELED1 and s4ELED2. The electrode sheet s4ELED1 includes a common electrode and four electrode sets, and the electrode sheet s4ELED2 includes a common electrode and four bent electrodes. In the electrode pattern, two sections at x=1 and x=2 are symmetric to each other, and two sections at x=3 and x=4 are symmetric to each other. Further, the combination of the left two sections at x=1 and x=2 of the electrode pattern is symmetric to the combination of the right two sections at x=3 and x=4 of the electrode pattern and vice versa.

Figure 29:
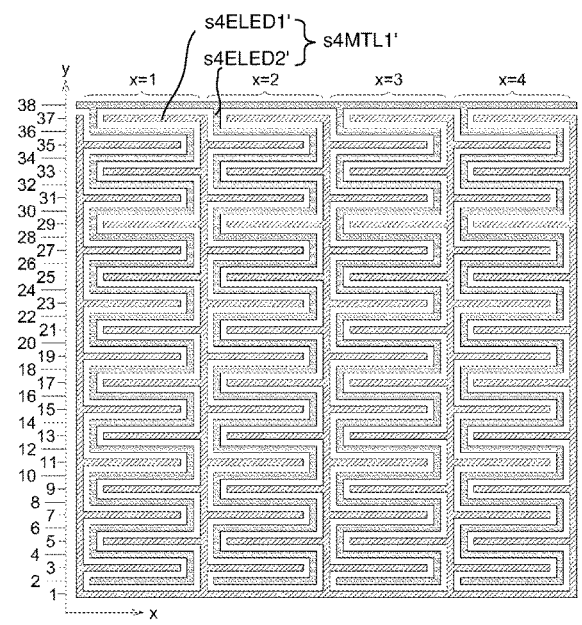
FIG. 29 is a schematic diagram illustrating that the electrode sheets of the metal layer s4MTL1' includes four sections according to a further embodiment of the present disclosure.

Please refer to FIG. 29, which is a schematic diagram illustrating that the electrode sheets of the metal layer s4MTL1$'$ includes four sections according to a further embodiment of the present disclosure. The metal layer s4MTL1$'$ includes electrode sheets s4ELED1$'$ and s4ELED2$'$. The electrode sheet s4ELED1$'$ includes a common electrode and four electrode sets, and the electrode sheet s4ELED2$'$ includes a common electrode and four bent electrodes. Four sections at x=1, 2, 3, and 4 of the electrode pattern are equal in shape.

Based on the description, the relations of the section number (X) and the quantities of the electrode set(s), the common electrode, and the bent electrode(s) are listed in Table 5.

TABLE 5

| Section number (X) | electrode set | Electrode sheet ELED1 common electrode | Electrode sheet ELED2 common electrode | Electrode sheet ELED2 bent electrode |
|---|---|---|---|---|
| X = 1 (FIGS. 6~15) | 2 left: flat comb right: flat comb | 1 | 1 | 1 |
| X = 2 (FIGS. 18~27) | 3 left: flat comb right: flat comb middle: fishbone | 1 | 1 | 2 |
| X = 4 (FIGS. 28, 29) | 5 left: flat comb right: flat comb middle: fishbone*2 | 1 | 1 | 4 |

The electrode sets and the bent electrodes increase with the section number. Corresponding to X sections, the electrode sheet ELED1 includes (X+1) electrode sets, and the electrode sheet ELED2 includes X bent electrodes. Each of the electrode sheets ELED1 and ELED2 still includes just one common electrode, which is not changed with the section number. As described above, the electrode patterns should be modified in response to the section number. Such modified electrode patterns are variants of the present disclosure in various applications, and details are not particularly given herein.

To sum up, the present disclosure designs specific electrode patterns on dummy metal layers to generate parasitic capacitance. Such a method of modifying the configuration of the electrode sheets ELED1 and ELED2 of the metal layer MTL1 and the configuration of the electrode sheets ELED3 and ELED4 of the metal layer MTL2 provides a metal capacitor C_MET connected to the MOS capacitor C_MOS in parallel. The use of the dummy metal layers together with the parasitic capacitance effect increases the capacitance of the boot capacitor Cb efficiently.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A metal capacitor comprising:
a first metal layer disposed above a substrate, comprising:
a first electrode sheet, comprising:
a first common electrode parallel to a first direction;
a first electrode set comprising:
a first main electrode parallel to a second direction and connected to the first common electrode; and
a plurality of first branch electrodes parallel to the first direction, wherein each of the plurality of first branch electrodes has a first end and a second end, and the first end of each first branch electrode is connected to the first main electrode, wherein the first common electrode is longer than each first branch electrode, and the first common electrode is placed at a side of the plurality of first branch electrodes; and
a second electrode sheet, comprising:
a second common electrode parallel to the first direction; and
a first bent electrode, comprising:
a plurality of first long electrodes parallel to the first direction and arranged in a column along the second direction, each of the plurality of first long electrodes having a first end and a second end; and
a plurality of first short electrodes parallel to the second direction, a first one of the plurality of first short electrodes being connected to the second common electrode,
wherein a first portion of the plurality of first short electrodes of the first bent electrode are connected to the first ends of the plurality of first long electrodes of the first bent electrode, and a second portion of the plurality of first short electrodes of the first bent electrode are connected to the second ends of the plurality of first long electrodes of the first bent electrode, and
a second metal layer disposed above the first metal layer, wherein a first coplanar capacitor is collectively formed between the first electrode sheet and the second electrode sheet, and a first vertical capacitor is formed between the first electrode sheet and the second metal layer.

2. The metal capacitor according to claim 1, wherein lengths of the plurality of first branch electrodes are equivalent.

3. The metal capacitor according to claim 1, wherein the first electrode sheet further comprises:
a second electrode set, comprising:
a second main electrode parallel to the second direction and connected to the first common electrode; and
a plurality of second branch electrodes parallel to the first direction, wherein each of the plurality of second branch electrodes has a first end and a second end, and the second end of each second branch electrode is connected to the second main electrode,
wherein the second end of each first branch electrode extends toward the second main electrode, and the first end of each second branch electrode extends toward the first main electrode, wherein the first common electrode is longer than each second branch electrode, and the first common electrode is placed at a side of the plurality of second branch electrodes.

4. The metal capacitor according to claim 3, wherein lengths of the plurality of second branch electrodes are equivalent.

5. The metal capacitor according to claim 3, wherein the first portion of the plurality of first short electrodes of the first bent electrode are aligned with a first straight line along the second direction, and the second portion of the plurality of first short electrodes of the first bent electrode are aligned with a second straight line along the second direction, the first portion of the plurality of first short electrodes and the second portion of the plurality of first short electrodes being alternate along the second direction.

6. The metal capacitor according to claim 1, wherein the second common electrode is longer than each first long electrode.

7. The metal capacitor according to claim 1, wherein the first main electrode is closer to the first ends of the plurality of first long electrodes than the second main electrode, and the second main electrode is closer to the second ends of the plurality of first long electrodes than the first main electrode.

8. The metal capacitor according to claim 1, wherein the second metal layer comprises:
a third electrode sheet; and
a fourth electrode sheet, wherein the third electrode sheet and the fourth electrode sheet collectively form a second coplanar capacitor,
wherein at least a portion of the fourth electrode sheet is arranged above the first electrode sheet, and the first electrode sheet and the fourth electrode sheet collectively form the first vertical capacitor, wherein at least a portion of the third electrode sheet is arranged above the second electrode sheet, and the second electrode sheet and the third electrode sheet collectively form a second vertical capacitor,
wherein the first electrode sheet and the third electrode sheet receive a first voltage, the second electrode sheet and the fourth electrode sheet receive a second voltage, and the first coplanar capacitor, the second coplanar capacitor, the first vertical capacitor and the second vertical capacitor are connected in parallel.

9. The metal capacitor according to claim 8, wherein the third electrode sheet comprises:
a third common electrode parallel to the first direction; and
a third electrode set comprising:
a third main electrode parallel to the second direction and connected to the third common electrode; and
a plurality of third branch electrodes parallel to the first direction, wherein each of the plurality of third branch electrodes has a first end and a second end, and the first end of each third branch electrode is connected to the third main electrode, wherein the third common electrode is longer than each third branch electrode, and the third common electrode is placed at a side of the plurality of third branch electrodes.

10. The metal capacitor according to claim 9, wherein the third electrode sheet further comprises:
a fourth electrode set, comprising:
a fourth main electrode parallel to the second direction and connected to the third common electrode; and
a plurality of fourth branch electrodes parallel to the first direction, wherein each of the plurality of fourth branch electrodes has a first end and a second end, and the second end of each fourth branch electrode is connected to the fourth main electrode,
wherein the second end of each third branch electrode extends toward the fourth main electrode, and the first end of each fourth branch electrode extends toward the third main electrode, wherein the third common electrode is longer than each fourth branch electrode, and the third common electrode is placed at a side of the plurality of fourth branch electrodes.

11. The metal capacitor according to claim 10, wherein the third main electrode is disposed right above the first main electrode; and the fourth main electrode is disposed right above the second main electrode.

12. The metal capacitor according to claim 10, wherein the plurality of third branch electrodes and the plurality of fourth branch electrodes are disposed right above the plurality of first long electrodes of the first bent electrode.

13. The metal capacitor according to claim 9, wherein the fourth electrode sheet comprises:
a fourth common electrode parallel to the first direction; and
a second bent electrode comprising:
a plurality of second long electrodes parallel to the first direction and arranged in a column along the second direction, each of the plurality of second long electrodes having a first end and a second end; and
a plurality of second short electrodes parallel to the second direction, a first one of the plurality of second short electrodes being connected to the fourth common electrode,
wherein a first portion of the plurality of second short electrodes of the second bent electrode are aligned with a third straight line second along the second direction, and a second portion of the plurality of second short electrodes of the second bent electrode are aligned with a fourth straight line along the second direction, the first portion of the plurality of second short electrodes and the second portion of the plurality of second short electrodes being alternate along the second direction,
wherein the first portion of the plurality of second short electrodes of the second bent electrode are connected to the first ends of the plurality of second long electrodes of the second bent electrode, and the second portion of the plurality of second short electrodes of the second bent electrode are connected to the second ends of the plurality of second long electrodes of the second bent electrode.

14. The metal capacitor according to claim 13, wherein the plurality of second long electrodes of the second bent electrode are disposed right above the plurality of first branch electrodes and the plurality of second branch electrodes.

15. The metal capacitor according to claim 8, wherein the third electrode sheet comprises:
a fifth common electrode parallel to the first direction;
a third bent electrode comprising:
a plurality of third long electrodes parallel to the first direction and arranged in a column along the second direction, each of the plurality of third long electrodes having a first end and a second end; and
a plurality of third short electrodes parallel to the second direction, a first one of the plurality of third short electrodes being connected to the fifth common electrode,
wherein a first portion of the plurality of third short electrodes of the third bent electrode are aligned with a fifth straight line second along the second direction, and a second portion of the plurality of third short electrodes of the third bent electrode are aligned with a sixth straight line along the second direction, the first portion of the plurality of third short electrodes and the second portion of the plurality of third short electrodes being alternate along the second direction,
wherein the first portion of the plurality of third short electrodes of the third bent electrode are connected to the first ends of the plurality of third long electrodes of the third bent electrode, and the second portion of the plurality of third short electrodes of the third bent electrode are connected to the second ends of the plurality of third long electrodes of the third bent electrode.

16. The metal capacitor according to claim 15, wherein the fourth electrode sheet further comprises:
a sixth common electrode parallel to the first direction; and
a fifth electrode set comprising:
a fifth main electrode parallel to the second direction and connected to the sixth common electrode; and
a plurality of fifth branch electrodes parallel to the first direction, wherein each of the plurality of fifth branch electrodes has a first end and a second end, and the first end of each fifth branch electrode is connected to the fifth main electrode, wherein the sixth common electrode is longer than each fifth branch electrode, and the sixth common electrode is placed at a side of the plurality of fifth branch electrodes.

17. The metal capacitor according to claim 16, wherein the fourth electrode sheet further comprises:
a sixth electrode set, comprising:
a sixth main electrode parallel to the second direction and connected to the sixth common electrode; and
a plurality of sixth branch electrodes parallel to the first direction, wherein each of the plurality of sixth branch electrodes has a first end and a second end, and the second end of each sixth branch electrode is connected to the sixth main electrode,
wherein the second end of each fifth branch electrode extends toward the sixth main electrode, and the first end of each sixth branch electrode extends toward the fifth main electrode, wherein the sixth common electrode is longer than each sixth branch electrode, and the sixth common electrode is placed at a side of the plurality of sixth branch electrodes.

18. A metal capacitor comprising:
at least one metal layer disposed above a metal-oxide-semiconductor capacitor, comprising:
a first electrode sheet receiving a first voltage, comprising:
a first common electrode parallel to a first direction; and
a first electrode set comprising:
a first main electrode parallel to a second direction and connected to the first common electrode; and
a plurality of first branch electrodes parallel to the first direction, wherein each of the plurality of first branch electrodes has a first end and a second end, and the first end of each first branch electrode is connected to the first main electrode, wherein the first common electrode is longer than each first branch electrode, and the first common electrode is placed at a side of the plurality of first branch electrodes; and
a second electrode sheet receiving a second voltage, wherein the first electrode sheet and the second electrode sheet collectively form a coplanar capacitor, and the second electrode sheet comprises:
a second common electrode parallel to the first direction; and
a first bent electrode, comprising:
a plurality of first long electrodes parallel to the first direction and arranged in a column along the second direction, each of the plurality of first long electrodes having a first end and a second end; and a plurality of first short electrodes parallel to the second direction, a first one of the plurality of first short electrodes being connected to the second common electrode, wherein a first portion of the plurality of first short electrodes of the first bent electrode are connected to the first ends of the plurality of first long electrodes of the first bent electrode, and a second portion of the plurality of first short electrodes of the first bent electrode are connected to the second ends of the plurality of first long electrodes of the first bent electrode.

19. The metal capacitor according to claim 18, wherein the first electrode sheet further comprises:

a second electrode set, comprising:

a second main electrode parallel to the second direction and connected to the first common electrode; and a plurality of second branch electrodes parallel to the first direction, wherein each of the plurality of second branch electrodes has a first end and a second end, and the second end of each second branch electrode is connected to the second main electrode, wherein the second end of each first branch electrode extends toward the second main electrode, and the first end of each second branch electrode extends toward the first main electrode, wherein the first common electrode is longer than each second branch electrode, and the first common electrode is placed at a side of the plurality of second branch electrodes.

20. The metal capacitor according to claim 19, wherein lengths of the plurality of first branch electrodes are equivalent, and lengths of the plurality of second branch electrodes are equivalent.

\* \* \* \* \*